United States Patent
Lundstrum et al.

(10) Patent No.: US 9,252,769 B2
(45) Date of Patent: Feb. 2, 2016

(54) MICROCONTROLLER WITH OPTIMIZED ADC CONTROLLER

(71) Applicant: Microchip Technology Incorporated, Chandler, AZ (US)

(72) Inventors: Zeke Lundstrum, Chandler, AZ (US); Keith Curtis, Gilbert, AZ (US); Burke Davison, Chandler, AZ (US); Sean Steedman, Phoenix, AZ (US); Yann LeFaou, Tempe, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 585 days.

(21) Appl. No.: 13/633,616

(22) Filed: Oct. 2, 2012

(65) Prior Publication Data
US 2013/0088246 A1    Apr. 11, 2013

Related U.S. Application Data

(60) Provisional application No. 61/544,386, filed on Oct. 7, 2011.

(51) Int. Cl.
*H03M 1/00* (2006.01)
*H03K 17/96* (2006.01)

(52) U.S. Cl.
CPC ........... *H03K 17/9622* (2013.01); *H03K 2217/960705* (2013.01); *H03K 2217/960725* (2013.01); *H03K 2217/960765* (2013.01)

(58) Field of Classification Search
CPC .............. H03K 17/9622; H03K 2217/960765; H03K 2217/960705; H03K 2217/960725
USPC ................... 341/118, 122, 141, 155
See application file for complete search history.

(56) References Cited

U.S. PATENT DOCUMENTS 3,295,121 A    12/1966 Scheel ............... 340/629
3,832,678 A    8/1974 Gysell et al. ........... 340/587

(Continued)

FOREIGN PATENT DOCUMENTS

CN    1087739 A    6/1994    ............. G08B 17/11
CN    101261225 A    9/2008    ............. G01N 21/53

(Continued)

OTHER PUBLICATIONS

Bohn, Bruce, "AN1250: Microchip CTMU for Capacitive Touch Applications," Microchip Technology, Inc., XP055007432, URL:http://www.microchip.com/stellent/idcplg?IdcService=SS_GET_PAGE&nodeID=1824&appnote=en539441, 22 pages, Feb. 3, 2009.

Perme, Thomas et al., AN1298: Capacitive Touch Using Only an ADC ("CVD"), Microchip Technology, Inc., XP055007357, URL:http://www.microchip.com/stellent/idcplg?IdcService=SS_GET_PAGE&nodeId=1824&appnote=en545264, 4 pages, Oct. 7, 2009.

(Continued)

*Primary Examiner* — Khai M Nguyen

(74) *Attorney, Agent, or Firm* — Slayden Grubert Beard PLLC

(57) ABSTRACT

An analog-to-digital (ADC) controller is used in combination with a digital processor of a microcontroller to control the operation of capacitance measurements using the capacitive voltage division (CVD) method. The ADC controller handles the CVD measurement process instead of the digital processor having to run additional program steps for controlling charging and discharging of a capacitive touch sensor and sample and hold capacitor, then coupling these two capacitors together, and measuring the resulting voltage charge thereon in determining the capacitance thereof. The ADC controller may be programmable and its programmable parameters stored in registers.

34 Claims, 19 Drawing Sheets

(56) References Cited

U.S. PATENT DOCUMENTS

| | | | |
|---|---|---|---|
| 4,213,047 A | 7/1980 | Mccord | 250/381 |
| 4,222,045 A | 9/1980 | Cholin | 340/628 |
| 4,260,984 A | 4/1981 | Honma | 340/630 |
| 4,266,220 A | 5/1981 | Malinowski | 340/360 |
| 4,401,978 A | 8/1983 | Solomon | 340/628 |
| 4,538,137 A | 8/1985 | Kimura | 340/512 |
| 4,652,866 A | 3/1987 | Siegmann et al. | 340/628 |
| 4,672,324 A | 6/1987 | Van Kampen | 307/653 |
| 5,173,683 A | 12/1992 | Brighenti et al. | 340/505 |
| 5,243,330 A | 9/1993 | Thuillard | 340/629 |
| 5,422,807 A | 6/1995 | Mitra et al. | 700/79 |
| 5,633,591 A | 5/1997 | Childress et al. | 324/399 |
| 5,705,988 A | 1/1998 | Mcmaster | 340/628 |
| 5,966,078 A | 10/1999 | Tanguay | 340/636.1 |
| 6,257,049 B1 | 7/2001 | Greybush | 73/29.01 |
| 6,433,712 B1 | 8/2002 | Ohnhaeuser et al. | 341/118 |
| 6,661,346 B1 | 12/2003 | Wood et al. | 340/601 |
| 6,981,090 B1 | 12/2005 | Kutz et al. | 710/317 |
| 7,288,946 B2 | 10/2007 | Hargreaves et al. | 324/678 |
| 7,307,485 B1 | 12/2007 | Snyder et al. | 331/150 |
| 7,382,140 B2 | 6/2008 | Obrecht | 324/678 |
| 7,460,441 B2 | 12/2008 | Bartling | 368/118 |
| 7,764,213 B2 | 7/2010 | Bartling et al. | 341/152 |
| 7,834,773 B2 | 11/2010 | Kato | 340/630 |
| 8,031,094 B2 | 10/2011 | Hotelling et al. | 341/143 |
| 8,487,655 B1 | 7/2013 | Kutz et al. | 326/86 |
| 8,510,068 B2 | 8/2013 | Kawashima | 702/87 |
| 8,547,135 B1 | 10/2013 | Yarlagadda et al. | 326/38 |
| 8,836,350 B2 * | 9/2014 | Peter | 324/684 |
| 8,847,802 B2 | 9/2014 | Lundstrum et al. | 341/141 |
| 8,884,771 B2 | 11/2014 | Cooke et al. | 340/628 |
| 8,981,754 B1 | 3/2015 | Rohilla et al. | 323/312 |
| 9,035,243 B2 | 5/2015 | Lenkeit et al. | 250/287 |
| 2002/0078744 A1 | 6/2002 | Gehman et al. | 73/204.11 |
| 2002/0101345 A1 | 8/2002 | Pattok et al. | 340/516 |
| 2002/0153923 A1 | 10/2002 | Piasecki et al. | 326/7 |
| 2003/0058114 A1 | 3/2003 | Miller | 340/577 |
| 2004/0257235 A1 | 12/2004 | Right et al. | 340/628 |
| 2005/0030172 A1 | 2/2005 | Right et al. | 340/521 |
| 2007/0075710 A1 | 4/2007 | Hargreaves et al. | 324/658 |
| 2008/0012715 A1 | 1/2008 | Montgomery | 340/579 |
| 2008/0079148 A1 | 4/2008 | Leung et al. | 257/734 |
| 2008/0111714 A1 | 5/2008 | Kremin | 341/33 |
| 2008/0272826 A1 | 11/2008 | Smit et al. | 327/509 |
| 2008/0312857 A1 | 12/2008 | Sequine | 702/65 |
| 2009/0230305 A1 | 9/2009 | Burke et al. | 250/336.1 |
| 2009/0256817 A1 | 10/2009 | Perlin et al. | 345/174 |
| 2010/0059295 A1 | 3/2010 | Hotelling et al. | 178/18.06 |
| 2010/0060593 A1 | 3/2010 | Krah | 345/173 |
| 2010/0097015 A1 | 4/2010 | Knoedgen et al. | 318/135 |
| 2010/0102832 A1 | 4/2010 | Bartling et al. | 324/679 |
| 2010/0181180 A1 * | 7/2010 | Peter | 200/5 R |
| 2010/0231241 A1 | 9/2010 | Mueck et al. | 324/686 |
| 2010/0283760 A1 | 11/2010 | Leung et al. | 345/174 |
| 2010/0287571 A1 | 11/2010 | Mohammed et al. | 719/328 |
| 2010/0295555 A1 | 11/2010 | Emanuel et al. | 324/601 |
| 2011/0007028 A1 | 1/2011 | Curtis et al. | 345/174 |
| 2011/0234417 A1 | 9/2011 | Aleman et al. | 340/660 |
| 2011/0267287 A1 | 11/2011 | Bartling et al. | 345/174 |
| 2011/0267309 A1 | 11/2011 | Hanauer et al. | 345/174 |
| 2012/0005693 A1 | 1/2012 | Mohammed et al. | 719/328 |
| 2012/0098686 A1 | 4/2012 | Wang | 341/118 |
| 2012/0112728 A1 | 5/2012 | Bodo et al. | 323/311 |
| 2013/0088246 A1 | 4/2013 | Lundstrum et al. | 324/686 |
| 2013/0090873 A1 | 4/2013 | Lundstrum et al. | 702/64 |
| 2013/0126715 A1 | 5/2013 | Flaherty | 250/214 R |
| 2013/0298100 A1 | 11/2013 | Hastings et al. | 716/126 |
| 2013/0322439 A1 | 12/2013 | Verhollen et al. | 370/389 |

FOREIGN PATENT DOCUMENTS

| | | | | |
|---|---|---|---|---|
| CN | 102063774 A | 5/2011 | | G08B 17/10 |
| CN | 102096978 A | 6/2011 | | G08B 17/107 |
| CN | 102257543 A | 11/2011 | | G08B 11/00 |
| DE | 10357371 A1 | 7/2005 | | G08B 17/00 |
| DE | 102009030495 A1 | 1/2011 | | G01B 7/00 |
| EP | 1719947 A1 | 11/2006 | | F23N 5/12 |
| FR | 2473201 A1 | 7/1981 | | G08B 17/11 |
| GB | 1598821 A | 9/1981 | | G08B 17/11 |
| GB | 2117560 A | 10/1983 | | G01N 27/64 |
| GB | 2156126 A | 10/1985 | | G08B 17/00 |
| WO | 2006/138205 A1 | 12/2006 | | H03M 1/06 |

OTHER PUBLICATIONS

Davison, Burke, "AN1334: Techniques for Robust Touch Sensing Design," Microchip Technology, Inc., XP055047201, URL: http://www.microchip.com/downloads/en/AppNotes/01334A.pdf, 28 pages, Aug. 6, 2010.

Yedamale, Padmaraja et al., "AN1375: See What You Can Do with the CTMU," Microchip Technology, Inc., XP055047211, URL:http://www.microchip.com/downloads/en/AppNotes/CTMU%2001375a.pdf, 12 pages, May 11, 2011.

International Search Report and Written Opinion, Application No. PCT/US2012/058682, 12 pages, Dec. 17, 2012.

International Search Report and Written Opinion, Application No. PCT/US2012/058691, 13 pages, Dec. 19, 2012.

International Search Report and Written Opinion, Application No. PCT/US2012/058832, 11 pages, Jan. 22, 2013.

International Search Report and Written Opinion, Application No. PCT/US2013/052956, 12 pages, Jan. 28, 2014.

International Search Report and Written Opinion, Application No. PCT/US2012/058837, 14 pages, Feb. 18, 2013.

Yair, R., "Charge Sampling Method for Low Current Measurement," Review of Scientific Instruments, vol. 45, No. 3, 6 pages, Mar. 1974.

Margarita, Andrey, "Application Note AN2245: Smart Smoke Detector," Cypress Semiconductor Corporation, XP055054690, URL:http://www.psocdeveloper.com/uploads/tx_piapappnote/an2245_01.pdf, 12 pages, Feb. 22, 2005.

Perme, Thomas, "AN1101: Introduction to Capacitive Sensing," Microchip Technology, Inc., XP002693941, URL: http://ww1.microchip.com/downloads/en/AppNotes/01101A.pdf, 10 pages, Jun. 25, 2007.

Anonymous, "Delta-Sigma Modulation," Wikipedia, URL: http://en.wikipedia.org/w/index.php?title=Special:Book&bookcmd=download&collection_id=fa136df1282a073a&writer=rl&return_to=Delta-sigma modulation, 14 pages, 2012.

International Search Report and Written Opinion, Application No. PCT/US2012/058716, 10 pages, Mar. 15, 2013.

International Search Report and Written Opinion, Application No. PCT/US2012/069086, 10 pages, Apr. 5, 2013.

International Search Report and Written Opinion, Application No. PCT/US2012/069094, 12 pages, Apr. 5, 2013.

International Search Report and Written Opinion, Application No. PCT/US2012/058688, 11 pages, Apr. 5, 2013.

International Search Report and Written Opinion, Application No. PCT/US2012/069076, 11 pages, Apr. 10, 2013.

International Search Report and Written Opinion, Application No. PCT/US2012/070466, 13 pages, Apr. 24, 2013.

U.S. Advisory Action, U.S. Appl. No. 13/709,399, 3 pages, Sep. 8, 2015.

Cuilan, Tan, Research & Design of Wireless Smoke Detection System, Engineering Science and technology II, China Master's Theses (Chinese language), 1 page (English abstract), Sep. 15, 2009.

Chinese Office Action, Application No. 201280068100.7, 5 pages, Oct. 9, 2015.

Chinese Office Action, Application No. 201280067196.5, 13 pages, Oct. 28, 2015.

RE46C162/163: "CMOS Ionization Smoke Detector ASIC with Interconnect, Timer Mode and Alarm Memory," Microchip Technology Incorporated, 22 pages.

U.S. Non-Final Office Action, U.S. Appl. No. 13/709,399, 39 pages, Dec. 2, 2015.

* cited by examiner

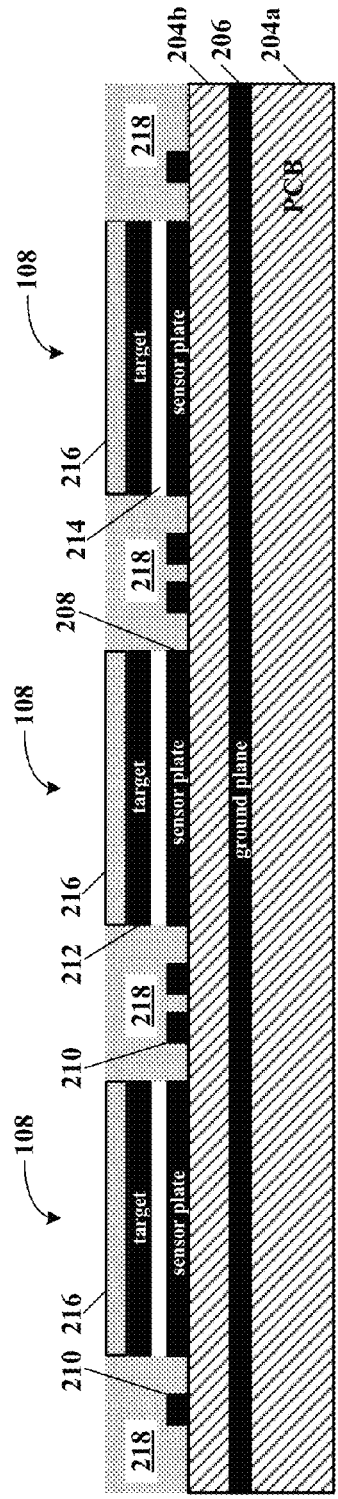
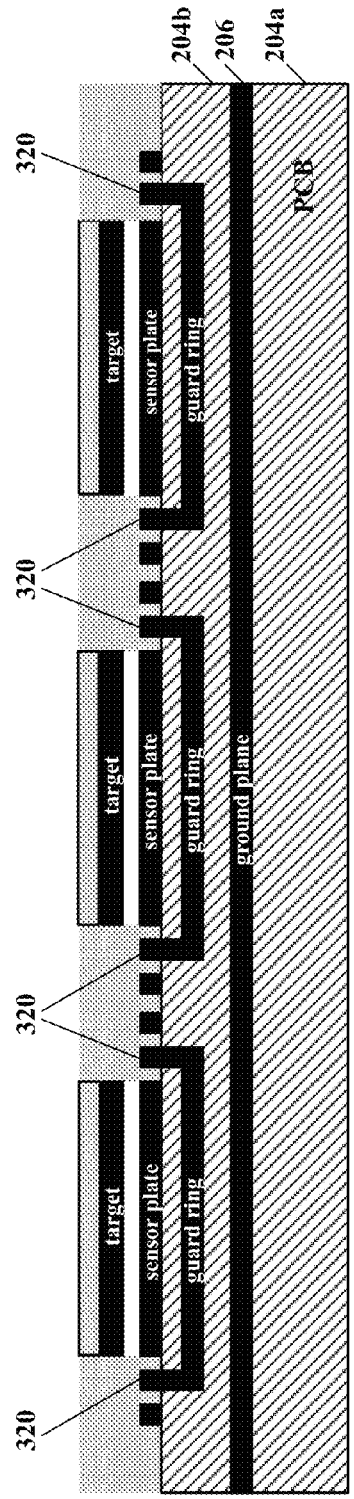
Figure 2
Figure 3

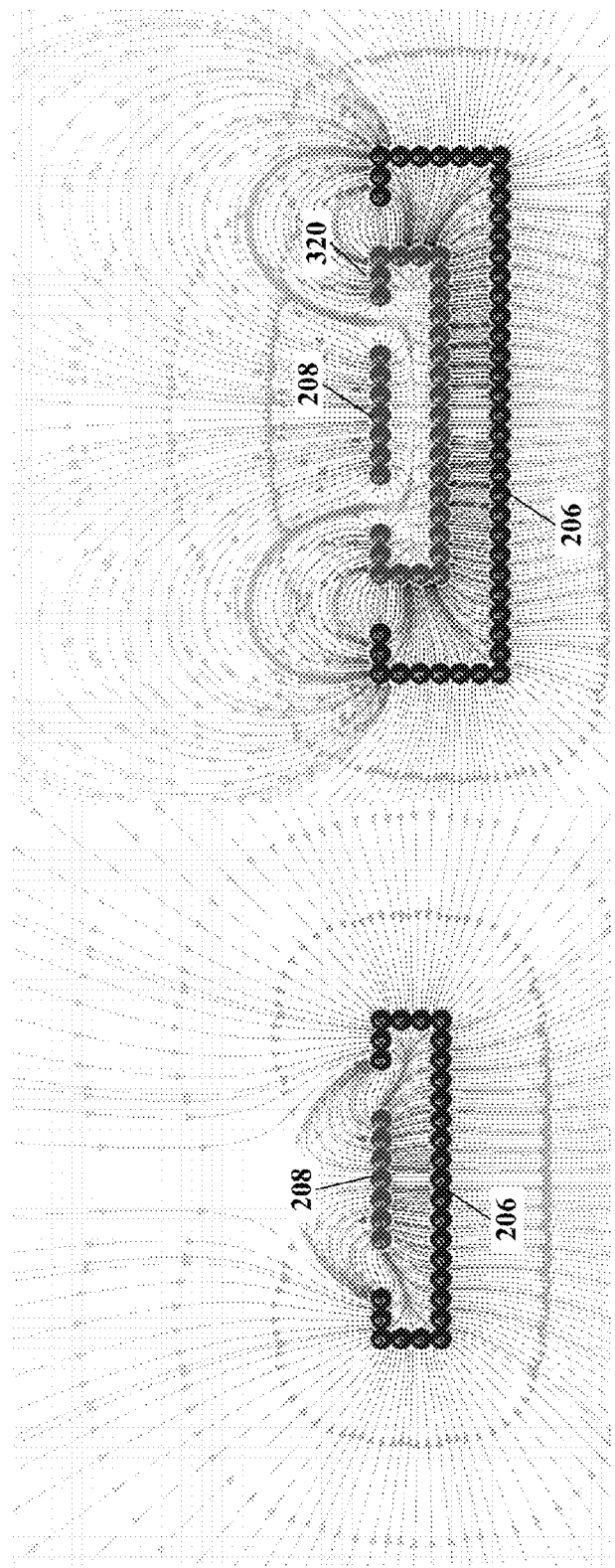

MICROCONTROLLER WITH OPTIMIZED ADC CONTROLLER

RELATED PATENT APPLICATION

This application claims priority to commonly owned U.S. Provisional Patent Application Ser. No. 61/544,386; filed Oct. 7, 2011; entitled "ADC With Internal Charge/Discharge Switches," by Zeke Lundstrum, Keith Curtis, Burke Davison, Sean Steedman and Yann LeFaou; which is hereby incorporated by reference herein for all purposes.

TECHNICAL FIELD

The present disclosure relates to analog to digital converters in particular for use in a microcontroller and, more particularly, for use in microcontroller with capacitive touch detection capabilities.

BACKGROUND

Touching of a capacitive sensor or approaching a capacitive proximity sensor by an object, e.g., a piece of metal, a finger, a hand, a foot, a leg, etc., changes certain parameters thereof, in particular the capacitance value of a capacitor that is built into the touch sensor used, for example, in human to machine interface devices, e.g., keypad or keyboard. Microcontrollers now include peripherals that enhance the detection and evaluation of such capacitive touch sensors. One such application utilizes capacitive voltage division (CVD) to evaluate whether a capacitive touch element has been touched or not. The CVD conversion process requires that the sensor and ADC sample-and-hold capacitors be charged/discharged by a divided voltage before being connected together for conversion of the divided voltage. The touch sensor capacitance can be charged/discharged by a driver connected to an external node (integrated circuit package pin), but the ADC sample-and-hold capacitor has to be connected to an external pin to be discharged/charged. Handling the charge/discharge of the ADC capacitance requires either an additional unused pin, or the use of the sensor pin driver to charge/discharge the capacitances sequentially, thereby increasing the conversion time. These additional steps require a number of additional program steps, digital processor power and execution time.

SUMMARY

Therefore what is needed is a more effective way to charge and discharge both the capacitive touch sensor and the ADC sampling capacitance by reducing the number of program steps necessary and thereby taking computation load off of the digital processor.

According to an embodiment, a microcontroller may comprise: a plurality of ports coupled with an analog bus through an analog multiplexer; an analog-to-digital converter (ADC) coupled with the analog bus, wherein the ADC comprises a sample and hold capacitor; and a sample and hold pull up/down circuit coupled with the sample and hold capacitor. According to a further embodiment, each one of the plurality of ports may be programmable to operate as an analog input port, a digital input or output port and comprises a respective port pull up/down circuit. According to a further embodiment, each one of the plurality of ports further comprises an override function allowing a primary analog or digital function to be overridden with a digital override value. According to a further embodiment, each port comprises a first multiplexer receiving digital and override values and a second multiplexer receiving digital tri-state and override control values, wherein the multiplexers are controlled by an override enable signal. According to a further embodiment, each one of the plurality of ports may be coupled with an associated tri-state register, an associated override control register, a digital output value register, and an override value register. According to a further embodiment, the primary analog function may be provided by an analog switch coupling an external pin of a port with the analog bus. According to a further embodiment, the analog switch may be part of the analog multiplexer. According to a further embodiment, the analog multiplexer comprises a plurality of analog switches and may be configured to allow more than one analog switch to be closed. According to a further embodiment, a programmable control unit automatically controlling a conversion sequence.

According to a further embodiment, a programmable precharge time of the conversion sequence the control unit may be operable to independently control an associated port to charge an external node to a first voltage and to decouple the internal sample & hold capacitor and charge the sample & hold capacitor to a second voltage different from said first voltage. According to a further embodiment, a programmable acquisition or share time of said conversion sequence of the control unit may be further operable to control the analog multiplexer to connect the external node with the sample & hold capacitor. According to a further embodiment, the control unit operable to include a further pre-charge and acquisition or share period to automatically perform two sequential measurements.

According to another embodiment, a microcontroller may comprise: a digital processor with memory; an analog-to-digital converter (ADC) controller coupled to the digital processor; a plurality of input/output ports that can be programmed to function as analog nodes or digital input output nodes; an analog multiplexer controlled by the ADC controller for selecting one of said analog nodes and coupling the analog node to an analog bus; an analog-to-digital converter (ADC) comprising a sample & hold capacitor coupled to the analog bus for converting an analog voltage on the analog bus to a digital representation thereof and having a digital output coupled to the digital processor for conveying the digital representation; and a sample and hold pull up/down circuit coupled with the sample and hold capacitor.

According to a further embodiment, each one of the plurality of input/output ports may be programmable to operate as an analog input port, a digital input or output port and comprises a respective port pull up/down circuit and further comprises an override function allowing a primary analog or digital function to be overridden with a digital override value.

According to a further embodiment, the microcontroller may comprise: a plurality of digital output drivers controlled by the ADC controller; a first analog node coupled to a first analog bus in the microcontroller; the first analog bus may be switchably coupled to a power supply common, a power supply voltage, or a second analog bus; the second analog bus may be switchably coupled to the power supply common, the power supply voltage, the sample and hold capacitor, or the first analog bus; and the sample and hold capacitor may be switchably coupled to either the first analog bus or an input of the ADC, wherein the first analog node may be adapted for coupling to an external capacitive sensor.

According to a further embodiment, the microcontroller may comprise at least two digital output nodes coupled to respective ones of the plurality of digital output drivers, wherein the at least two digital output nodes are adapted for coupling to a resistor voltage divider network that drives a voltage onto a guard ring associated with the capacitive sensor. According to a further embodiment, the microcontroller may comprise a second analog node coupled to the second analog bus and adapted for coupling to an external capacitor. According to a further embodiment, the microcontroller may comprise at least one internal capacitor switchably coupled to the second analog bus.

According to a further embodiment, the microcontroller may comprise at least one analog output driver coupled with the first analog bus and adapted for coupling to an external guard ring associated with the capacitive sensor, wherein a voltage on the guard ring may be substantially the same voltage as on the capacitive sensor. According to a further embodiment, the ADC controller controls an automatic conversion sequence such that for a programmable pre-charge time, the conversion sequence the ADC controller may be operable to independently control an associated port to charge an external node to a first voltage and to decouple the internal sample & hold capacitor and charge the sample & hold capacitor to a second voltage different from said first voltage.

According to a further embodiment, a programmable acquisition or share time of said conversion sequence of the ADC controller may be further operable to control the analog multiplexer to connect the external node with the sample & hold capacitor. According to a further embodiment, the ADC controller may be operable to include a further precharge and acquisition or share period to automatically perform two sequential measurements. According to a further embodiment, timing parameters for the conversion sequence are stored in registers.

According to yet another embodiment, a capacitive sensor system may comprise a capacitive sensor and a microcontroller. According to a further embodiment, the capacitive sensor system may comprise: a guard ring associated with the capacitive sensor; a first resistor coupled to the guard ring; a second resistor coupled to the guard ring; a plurality of digital output drivers controlled by the ADC controller; and at least two digital output nodes of the ADC controller coupled to respective ones of the plurality of digital output drivers, wherein one of the at least two digital output nodes may be coupled to the first resistor and the other one of the at least two digital output nodes may be coupled to the second resistor.

According to still another embodiment, a method for measuring capacitance of a capacitive sensor with a microcontroller having a plurality of ports coupled with an analog bus through an analog multiplexer; an analog-to-digital converter (ADC) coupled with the analog bus, wherein the ADC comprises a sample & hold capacitor; and a sample & hold pull up/down circuit coupled with the sample and hold capacitor, said method may comprise the steps of: coupling one of the plurality of ports with the capacitive sensor, and for a pre-charge period, independently charging the capacitive sensor by means of said one of the plurality of ports to a first voltage and decoupling the internal sample & hold capacitor by means of said analog multiplexer and charging the sample & hold capacitor to a second voltage different from said first voltage by means of said sample & hold pull up/down circuit.

According to a further embodiment of the method, the steps for the pre-charge period are automatically performed by an ADC controller independent from a central processing unit of said microcontroller. According to a further embodiment of the method, for a programmable acquisition or share time period the method further comprises controlling the analog multiplexer to connect the capacitive sensor with the sample & hold capacitor to share charges on the sample & hold capacitor and the capacitive sensor. According to a further embodiment of the method may comprise decoupling said sample & hold capacitor from the one of the plurality of ports and then determining a first charge value of the sample & hold capacitor by means of the ADC.

According to a further embodiment of the method, the steps for determining the first charge value are automatically performed by an ADC controller independent from a central processing unit of said microcontroller. According to a further embodiment of the method, while determining the charge value, the capacitive sensor may be pre-charging to the second voltage. According to a further embodiment of the method, after the step of determining the charge value, then the step of pre-charging the sample & hold capacitor to the first voltage.

According to a further embodiment of the method, after the step of pre-charging the sample & hold capacitor, then performing the step of controlling the analog multiplexer to connect the capacitive sensor with the sample & hold capacitor to share charges on the sample & hold capacitor and the capacitive sensor. According to a further embodiment of the method, after the step of decoupling said sample & hold capacitor from the one of the plurality of ports and then determining a second charge value of the sample & hold capacitor by means of the ADC. According to a further embodiment of the method, the steps for determining the first and second charge value are automatically performed by an ADC controller independent from a central processing unit of said microcontroller.

BRIEF DESCRIPTION OF THE DRAWINGS

A more complete understanding of the present disclosure may be acquired by referring to the following description taken in conjunction with the accompanying drawings wherein:

FIG. 2 illustrates a schematic elevational view of capacitive sensor keys shown in FIG. 1;

FIG. 3 illustrates a schematic elevational view of capacitive sensor keys shown in FIG. 1 and having capacitive guard rings around each of the capacitive sensors, according to a specific example embodiment of this disclosure;

FIG. 5 illustrates a schematic elevational view of electrostatic field lines surrounding a capacitive sensor and grounded shield;

FIG. 6 illustrates a schematic elevational view of electrostatic field lines surrounding a capacitive sensor, guard ring and grounded shield, according to the teachings of this disclosure;

Figure 1:
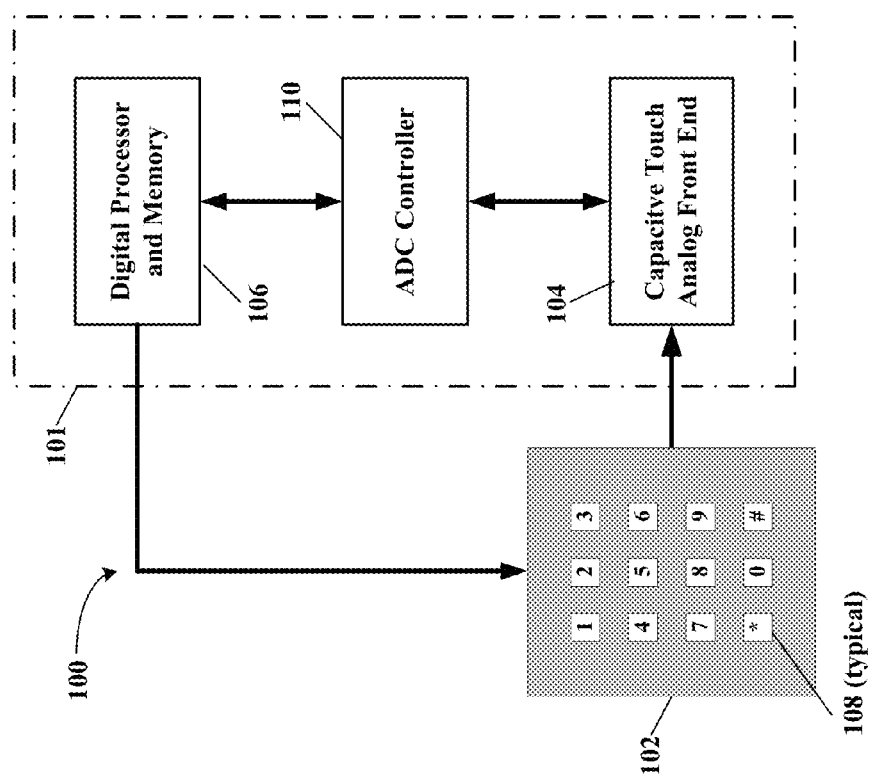
FIG. 1 illustrates a schematic block diagram of an electronic system having a capacitive touch keypad, a capacitive touch analog front end and a digital processor, according to the teachings of this disclosure.

While the present disclosure is susceptible to various modifications and alternative forms, specific example embodiments thereof have been shown in the drawings and

DETAILED DESCRIPTION

According to various embodiments disclosed herein, an ADC controller can be used to charge/discharge the capacitive touch sensor and ADC sample-and-hold capacitor. In addition, the ADC controller may control a voltage on a guard ring adjacent to the capacitive touch sensor. By using the ADC controller to control the timing of the charging and discharging of both the capacitive touch sensor and the ADC sampling capacitance, and in addition, the guard ring, effectively reduces the number of program steps that the digital processor has to perform, thereby increasing capacitive value computational speed of the processor and/or reducing power utilization for capacitive touch sensor scanning purposes.

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of an electronic system having a capacitive touch keypad, a capacitive touch analog front end and a digital processor, according to the teachings of this disclosure. A microcontroller integrated circuit device 101 may comprise a digital processor and memory 106, an analog-to-digital converter (ADC) controller 110, one or more of input-output (I/O) ports (nodes), an analog-to-digital converter (ADC), precision timers, multifunction input and output nodes, digital-to-analog converter (DAC) or combinations thereof. A capacitive touch analog front end (AFE) 104 may be implemented with some of the aforementioned functions of the microprocessor 101. The capacitive touch AFE 104 may be coupled to a matrix of capacitive sensor keys 102, e.g., pushbuttons, levers, toggles, targets, handles, knobs, etc., through an analog multiplexer (not shown).

The ADC controller 110 and capacitive touch AFE 104 facilitate, with a single low-cost integrated circuit microcontroller 101, all active functions needed in determining when there is actuation of capacitive sensors by, for example but is not limited to, pressing and deflecting a target key that changes the capacitance value of an associated capacitive sensor. The capacitive touch AFE 104 measures the capacitance value of each sensor of the matrix of capacitive sensor keys 102 and converts the capacitance values into respective analog direct current (DC) voltages that are read and converted into digital values with an analog-to-digital converter (ADC) (not shown) and read by the digital processor 106.

The ADC controller 110 may control the capacitive touch AFE 104, switches for charging and discharging the capacitance touch sensors of the keys 102, timing of the steps required in determining capacitance values, sampling and conversion of the charge voltage on a sample and hold capacitor of an analog-to-digital converter (ADC), etc. The ADC controller 110 may be programmable and its programmable parameters stored in registers (not shown).

The digital processor 106 may supply clock and control request functions to the ADC controller 110, read the digital output from the ADC, and select each key of the matrix of capacitive sensor keys 102. When actuation of a key of the matrix of capacitive sensor keys 102 is determined, the digital processor 106 will take an appropriate action. More detailed descriptions of various capacitive touch systems are more fully disclosed in Microchip Technology Incorporated application notes AN1298, AN1325 and AN1334, available at www.microchip.com, and are hereby incorporated by reference herein for all purposes.

Referring to FIG. 2, depicted is a schematic elevational view of capacitive sensor keys shown in FIG. 1. A substrate 204, e.g., printed circuit board (PCB), may have a ground plane (optional) 206 that may be used for electromagnetic interference (EMI) shielding. Capacitive sensor plates 208 may be transposed on a face of the substrate 204 and in proximity to the ground plane 206 (optional). Other circuit conductors 210 (e.g., PCB traces) may also be in close proximity to the capacitive sensor plates 208. Touch targets 212 may lay over respective ones of the capacitive sensor plates 208 and may have an air gap 214 therebetween. It is contemplated and within the scope of this disclosure that a touch target 212, as shown in FIG. 2, may be replaced by any object that changes the capacitance of the capacitive sensor plate 208, e.g., a piece of metal, a finger, a hand, a foot, a leg, etc. Coverings 216 may be placed over the capacitive sensor plate 208 and/or be part of the touch targets 212 (optional) and may have alpha-numerical information engraved thereon. Each of the capacitive touch keys 108 comprises a sensor plate 208 and covering 216. Dielectric spacers 218 are located between each of the capacitive touch keys 108. Optionally, a touch target 212 may be added over each respective sensor plate 208.

The ground plane 206 (optional) and/or circuit conductors 210 may be at different voltage potentials then the capacitive sensor plates 208. This creates parasitic capacitance between the capacitive sensor plate 208 and portions of the ground plane 206 (optional) and/or circuit conductors 210 in close proximity to the capacitive sensor plate 208. See FIG. 5 for a schematic representation of electrostatic fields between the capacitive sensor plate 208 and surrounding conductors at different voltage potential. Note the strong electrostatic field lines between the capacitive sensor plate 208 and the surrounding conductors. This parasitic capacitance limits detection resolution of a change in the capacitance value of the capacitive sensor plate 208 occurring during a touch thereto. Parasitic capacitance similarly affects the connections between the capacitive sensor plates 208 and the AFE 104. It also limits the amount of noise shielding that may be employed in capacitive touch systems.

Referring to FIG. 3, depicted is a schematic elevational view of capacitive sensor keys shown in FIG. 1 and having capacitive guard rings around each of the capacitive sensors, according to a specific example embodiment of this disclosure. A guard ring 320 around each of the capacitive sensor plates 208 is added to the capacitive sensor keys 102a. Otherwise all other elements are substantially the same as the capacitive sensor keys 102 shown in FIG. 2. By maintaining a voltage on the guard rings 320 that is substantially the same as the voltage on the respective capacitive sensor plate 208, parasitic capacitances are significantly reduced. Thereby increasing detection resolution of a change in the capacitance value of the capacitor sensor plate 208 occurring during a touch thereto. In addition, providing for enhanced noise shielding does not affect the detection resolution as it would in the configuration shown in FIG. 2. See FIG. 6 for a schematic representation of electrostatic fields between the capacitive sensor plate 208, guard ring 320, surrounding ground plane 206 (optional) and conductors 210 (not shown), wherein the capacitive sensor plate 208 and the guard ring 320 are at substantially the same voltage potential. Note the much weaker electrostatic field lines (longer lines) between the capacitive sensor plate 208 and the surrounding conductors and the ground plane 206 (optional). There is substantially no parasitic capacitance between the capacitive sensor plate 208 and the guard ring 320 because both are at substantially the same voltage potential.

Figure 4:
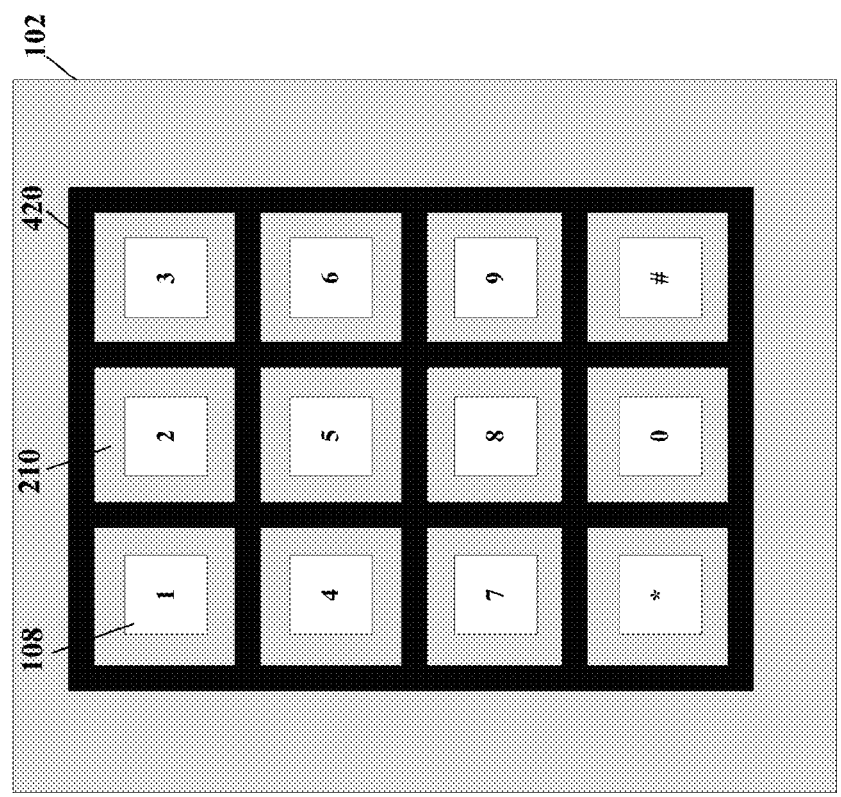
FIG. 4 illustrates a schematic plan view of capacitive sensor keys shown in FIG. 1 and having guard rings around each of the capacitive sensors, according to another specific example embodiment of this disclosure.

Referring to FIG. 4, depicted is a schematic plan view of capacitive sensor keys shown in FIG. 1 and having guard rings around each of the capacitive sensors, according to another specific example embodiment of this disclosure. Each of the capacitive sensor plates 208 of the touch keys 108 are surrounded by guard rings 420 that are electrically coupled together and have the same voltage potential thereon. In this configuration only one capacitive sensor plate 208 capacitance value is determined at a time so the entire matrix of guard rings 420 assumes the voltage potential of the capacitive sensor plate 208 having its capacitance value determined by the AFE 104, ADC controller 110 and digital processor 106, as more fully described hereinafter.

Each of the guard rings 320 shown in FIG. 3 may be independent of one another and have different voltages thereon, but would require more connections to the digital processor 106. So unless simultaneous capacitance readings of more than one capacitive sensor plate 208 needs to be determined at the same time, the single voltage potential guard rings 420 (FIG. 4) would suffice and require fewer circuit connections to the digital processor 106.

Figure 7:
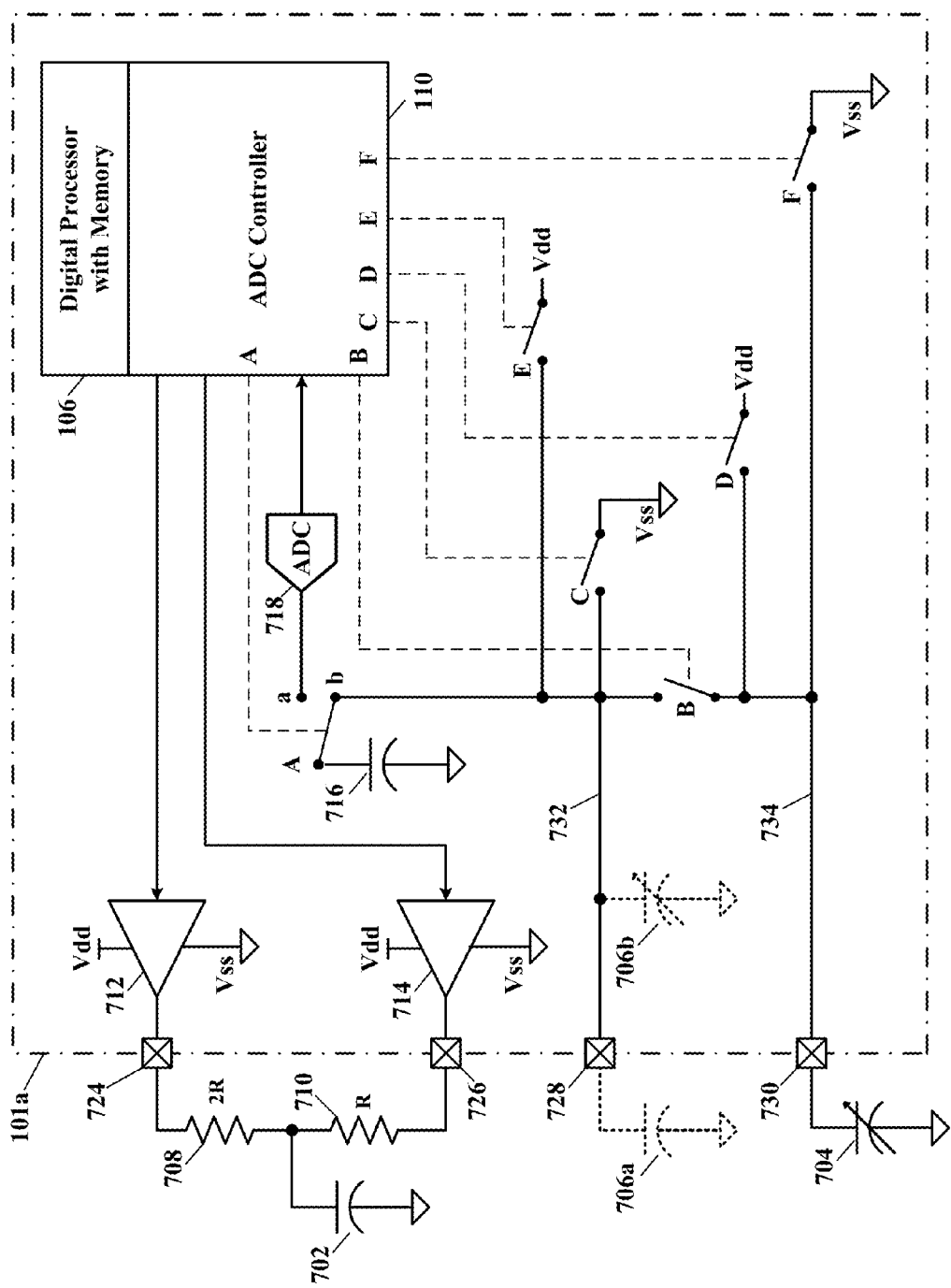
FIG. 7 illustrates a schematic diagram of a mixed signal integrated circuit device having CVD processing capabilities for a capacitive sensor and associated guard ring, according to a specific example embodiment of this disclosure.

Referring to FIG. 7, depicted is a schematic diagram of a mixed signal integrated circuit device having CVD processing capabilities for a capacitive sensor and associated guard ring, according to a specific example embodiment of this disclosure. The mixed signal integrated circuit device 101a shown in FIG. 7, e.g., a microcontroller, is applicable when using the capacitive voltage divider (CVD) method of determining the capacitance value of the capacitive sensor plate 208. By first determining the capacitance value of an untouched capacitive sensor plate 208 and then determining a subsequent capacitance value of a touched capacitive sensor plate 208, a touch to that capacitive sensor plate 208 may be determined based upon the change in capacitance thereof. In CVD two capacitors are charged/discharged to opposite voltage values. Then the two oppositely charged capacitors are coupled together and a resulting voltage is measured on the connected two capacitors. A more detailed explanation of CVD is presented in commonly owned United States Patent Application Publication No. US 2010/0181180, incorporated by reference herein for all purposes. The switches shown in FIG. 7 may be, for example but are not limited to, field effect transistor (FET) switches. The nodes 728 and 730 are analog nodes coupled to respective internal single line (conductor) analog buses 732 and 734, respectively.

The capacitance of the capacitive sensor plate 208 is represented by variable capacitor 704 (first CVD capacitor), and the second CVD capacitor may be the sample and hold capacitor 716 if these two capacitors have fairly close capacitive values e.g., 1:1 to about 3:1. The reason for this in CVD is that part of the charge from one capacitor is transferred to the other capacitor having no charge or an opposite charge. For example, when the two CVD capacitors are equal in value, half of the charge on one will be transferred to the other capacitor. A two to once capacitance ratio will result in ⅓ of the charge being transferred to or taken from the smaller (1/2C) capacitor depending upon which of one the capacitors was initially charged. When the sample and hold capacitor 716 is substantially smaller than the capacitive sensor capacitor 704, additional capacitance 706a may be added externally to node 728, and/or internal capacitance 706b may be added independently of node 728 so that the combined capacitance of the capacitors 716, 706a and/or 706b have sufficient capacitance in relation to the capacitance value of the capacitive sensor capacitance 704 to meet the criteria above. This results in the best resolution in determining a capacitance value using CVD. Capacitor 716 is also the sample and hold capacitor used to sample and hold the analog voltage resulting after charge is transferred between the two CVD capacitors. Once the charge transfer is complete, an analog-to-digital converter (ADC) 718 converts the resulting charge voltage to a digital value that is read by the ADC controller 110/digital processor 106 for further processing and determination of the capacitance value of the touch sensor capacitor 704.

In the example hereinafter presented, the capacitance values for the capacitor 704 (first CVD capacitor), capacitor 706a (an externally connected capacitor) and/or capacitor 706b (an internally connected capacitor) may be selected in combination with the sample and hold capacitor 716 to result in a combined charge voltage of ⅓ or ⅔ of the Vdd voltage depending on whether the first CVD capacitor 704 is discharged to Vss or charged to Vdd, and the combination of capacitors 706 and 716 are charged to Vdd or discharged to Vss, respectively. In this example, the capacitor 704 is about twice the capacitance as the capacitance of the parallel connected combination of capacitors 706 and 716. The resulting quiescent voltage after coupling the two opposite polarity charged CVD capacitors together will be about ⅓*Vdd when the capacitor 704 was initially discharged to Vss, and about ⅔*Vdd when the capacitor 704 was initially charged to Vdd.

Knowing the expected quiescent voltages of the combination of all capacitors connected in parallel allows creating the appropriate voltages for the guard ring 320 or 420 surrounding the respective sensor plate 208 being evaluated for a capacitance value by the digital processor 106. When Vdd is desired on the guard ring 320 or 420, both outputs from the digital drivers 712 and 714 are at substantially Vdd (logic high). When Vss is desired on the guard ring 320 or 420, both outputs from the digital drivers 712 and 714 are at substantially Vss (logic low). When ⅓*Vdd is desired on the guard ring 320 or 420, the output from the digital driver 714 is at Vss (logic low) and the output from the digital driver 712 is at substantially Vdd (logic high). When ⅔*Vdd is desired on the guard ring 320 or 420, the output from the digital driver 714 is at Vdd (logic high) and the output from the digital driver 712 is at substantially Vss (logic low).

By proper selection of a capacitance value for capacitor 706, and resistance values for resistors 708 and 710, guard ring voltages may easily be generated by the ADC controller 110 using just two digital outputs at nodes 724 and 726. Other voltage ratios may also be effectively used by proper selection of values for capacitor 706 and resistors 708 and 710. For example, if the combined capacitance of capacitors 706 and 716 are substantially equal to the capacitance of capacitor 704, the subsequent combined voltage will be ½*Vdd and the resistors 708 and 710 will be substantially the same resistance to produce ½*Vdd on the guard ring capacitance when appropriate.

Figure 8:
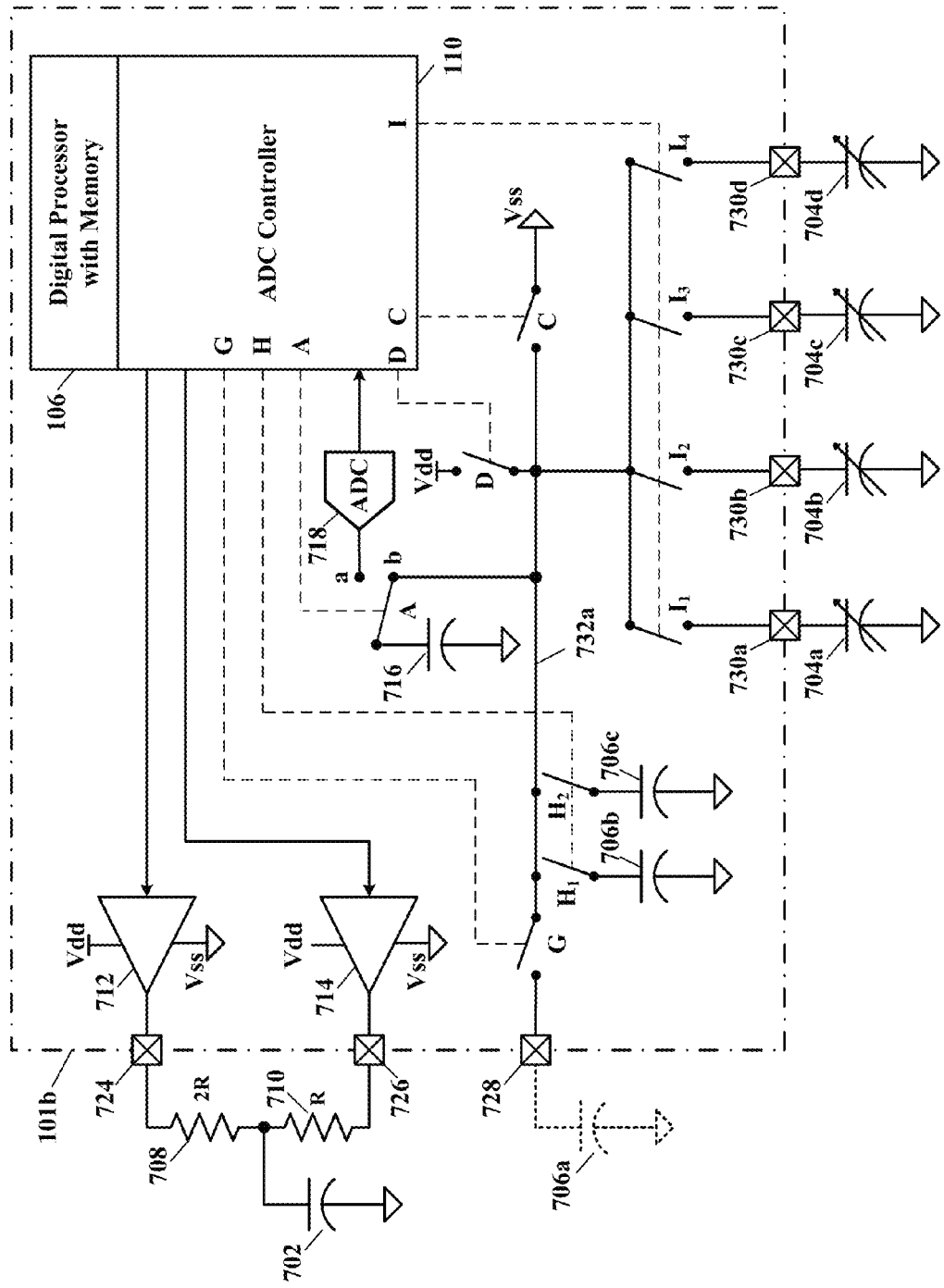
FIG. 8 illustrates a schematic diagram of a mixed signal integrated circuit device having CVD processing capabilities for a plurality of capacitive sensors and a guard ring, according to another specific example embodiment of this disclosure.

Referring to FIG. 8, depicted is a schematic diagram of a mixed signal integrated circuit device having CVD processing capabilities for a plurality of capacitive sensors and a guard ring, according to another specific example embodiment of this disclosure. The mixed signal integrated circuit device 101b shown in FIG. 8, e.g., a microcontroller, operates in substantially the manner as the device 101a shown in FIG. 7 except that there is only one single wire analog bus 732a; wherein internal capacitors 706b and 706c are decoupled from the bus 732a with switches H, and the external node 728 is decoupled from the bus 732a with switch G. Only one set of Vdd/Vss switches D and C are used wherein the first CVD capacitor 704 is charged/discharged during a different time period then the second CVD capacitor 716 (and 706) is discharged/charged. This saves a set of switches and a second internal analog bus (see FIG. 7 bus 734).

In addition, a plurality of switches I are used to multiplex each of the capacitive sensors 704 used in the capacitive touch keys 108 shown in FIG. 1. These features may also be incorporated into the circuit of FIG. 7. The analog multiplexer switches I select respective ones of the plurality of sensor capacitors 704 as the capacitive touch analog front end 104 scans the capacitive touch keys 108. The plurality of nodes 730 are typically multi-purpose programmable analog or digital inputs and/or outputs. For explanatory clarity in this disclosure only analog input/output (two way) configured nodes are shown. The digital processor, through the digital drivers 712 and 714, drives nodes 724 and 726 to appropriate logic levels for the selected one of the plurality of sensor capacitors 704.

Figure 9:
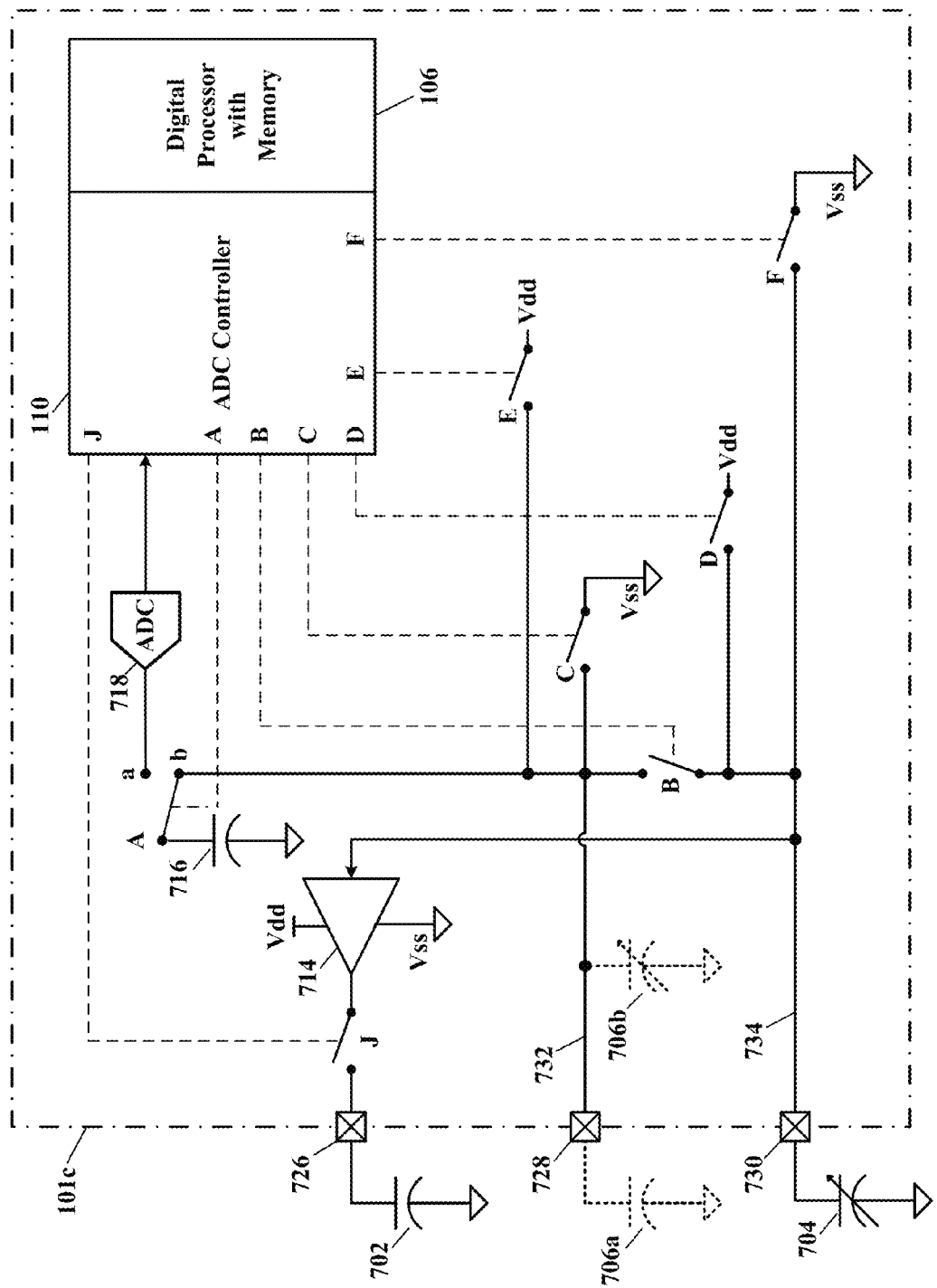
FIG. 9 illustrates a schematic diagram of a mixed signal integrated circuit device having CVD processing capabilities for a capacitive sensor and associated guard ring, according to a specific example embodiment of this disclosure.

Referring to FIG. 9, depicted is a schematic diagram of a mixed signal integrated circuit device having CVD processing capabilities for a capacitive sensor and associated guard ring, according to a specific example embodiment of this disclosure. The mixed signal integrated circuit device 101c shown in FIG. 9, e.g., a microcontroller, operates in substantially the manner as the device 101a shown in FIG. 7

Optionally, an analog buffer driver 714 having a high input impedance may be coupled to node 730 which is also coupled to the capacitor 704. The analog buffer driver 714 has a low impedance output that may be switchably coupled through switch J to the node 726 that is also coupled to the guard ring capacitance 702. The output voltage of the analog buffer driver 714 faithfully follows the voltage at the input thereto. Therefore, the voltage on the guard ring 320 or 420 substantially follows the voltage on the respective sensor plate 208 being evaluated for a capacitance value by the digital processor 106.

Figure 10:
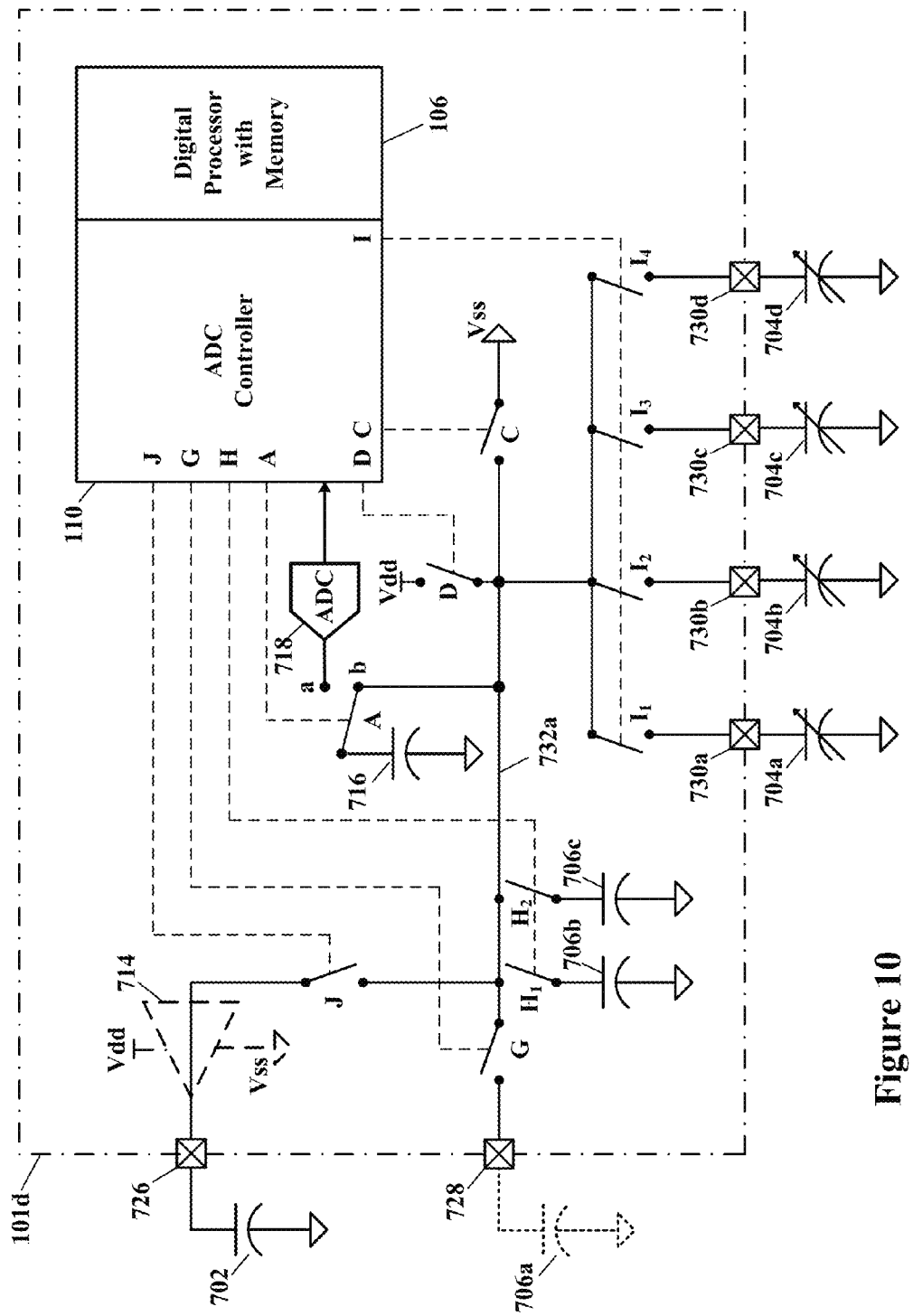
FIG. 10 illustrates a schematic diagram of a mixed signal integrated circuit device having CVD processing capabilities for plurality of capacitive sensors and a guard ring, according to another specific example embodiment of this disclosure.

Referring to FIG. 10, depicted is a schematic diagram of a mixed signal integrated circuit device having CVD processing capabilities for a plurality of capacitive sensors and a guard ring, according to another specific example embodiment of this disclosure. The mixed signal integrated circuit device 101d shown in FIG. 10, e.g., a microcontroller, operates in substantially the manner as the device 101b shown in FIG. 8.

Optionally, an analog buffer driver 714 having a high input impedance may be coupled between the node 726 and the single wire analog bus 732a through switch J when the selected one of the plurality of capacitors 704 is being charged/discharged. The analog buffer driver 714 has a low impedance output coupled to the node 726 which is coupled to the guard ring capacitance 702. The output voltage of the analog buffer driver 714 faithfully follows the voltage on the selected one of the plurality of capacitors 704.

With respect to FIGS. 7 through 10, it is contemplated and within the scope of this disclosure that various embodiments of a microcontroller may include external node 728 to allow for connection of an external capacitor 706a as explained hereinabove. An additional adjustable capacitor(s) 706b (and 706c) may be present internally and may be switchably coupled to the analog bus 732a. However, other embodiments may not provide for such an external node 728. Instead, either capacitance 716 may have the appropriate value or an additional internal capacitance 706b, for example a variable capacitance, is or can be connected to bus 732. Furthermore, as each external node 726, 728, and 730 may be programmable to support multiple functions, additional switches (not shown in FIG. 7) may be used to allow to use nodes 726, 728, and 730 for other functions as will be explained in more detail hereinafter with respect to FIGS. 19 and 20.

Figure 11:
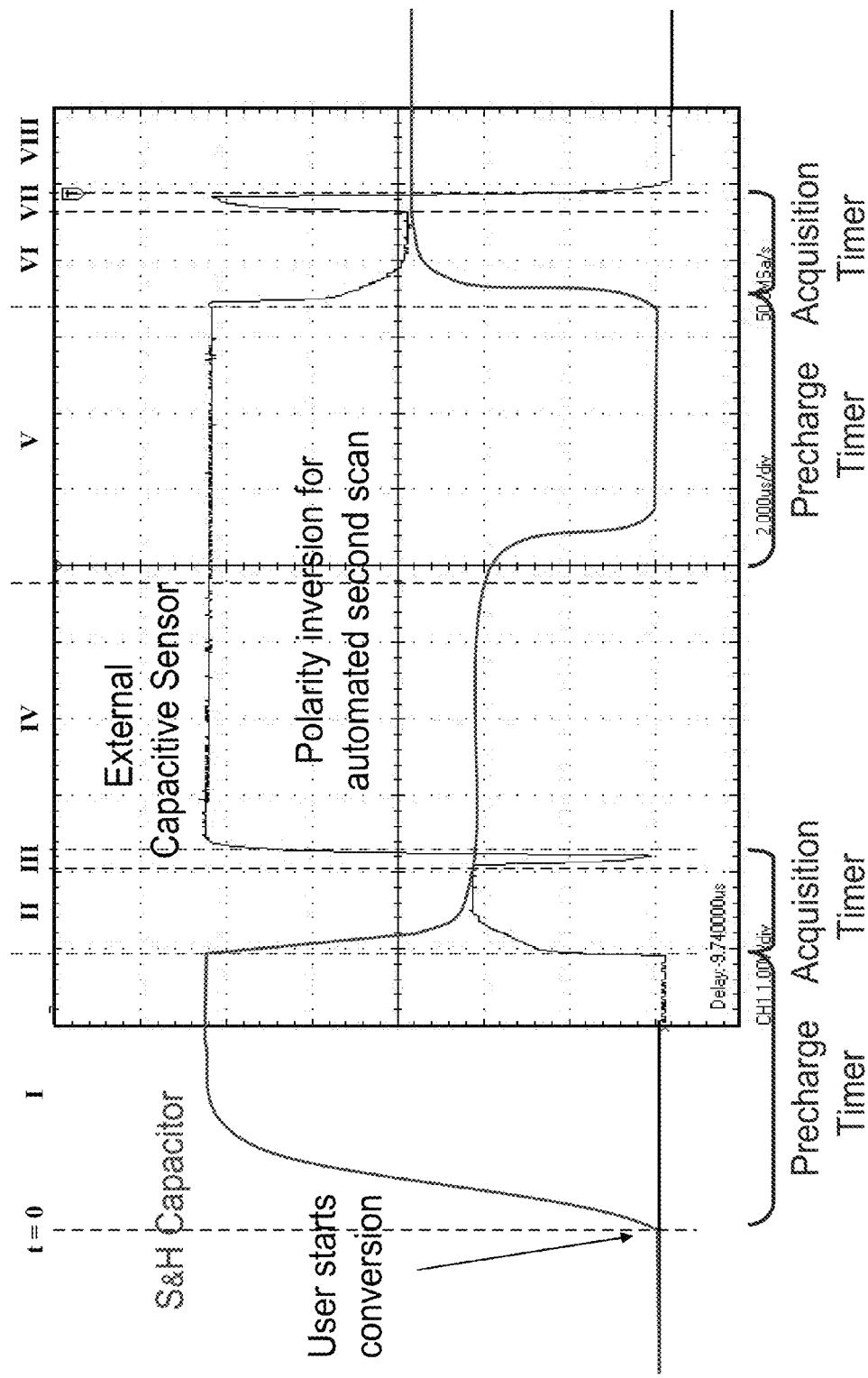
FIG. 11 illustrates a schematic voltage-time diagram of capacitance conversions, according to specific example embodiments of this disclosure.
Figure 12:
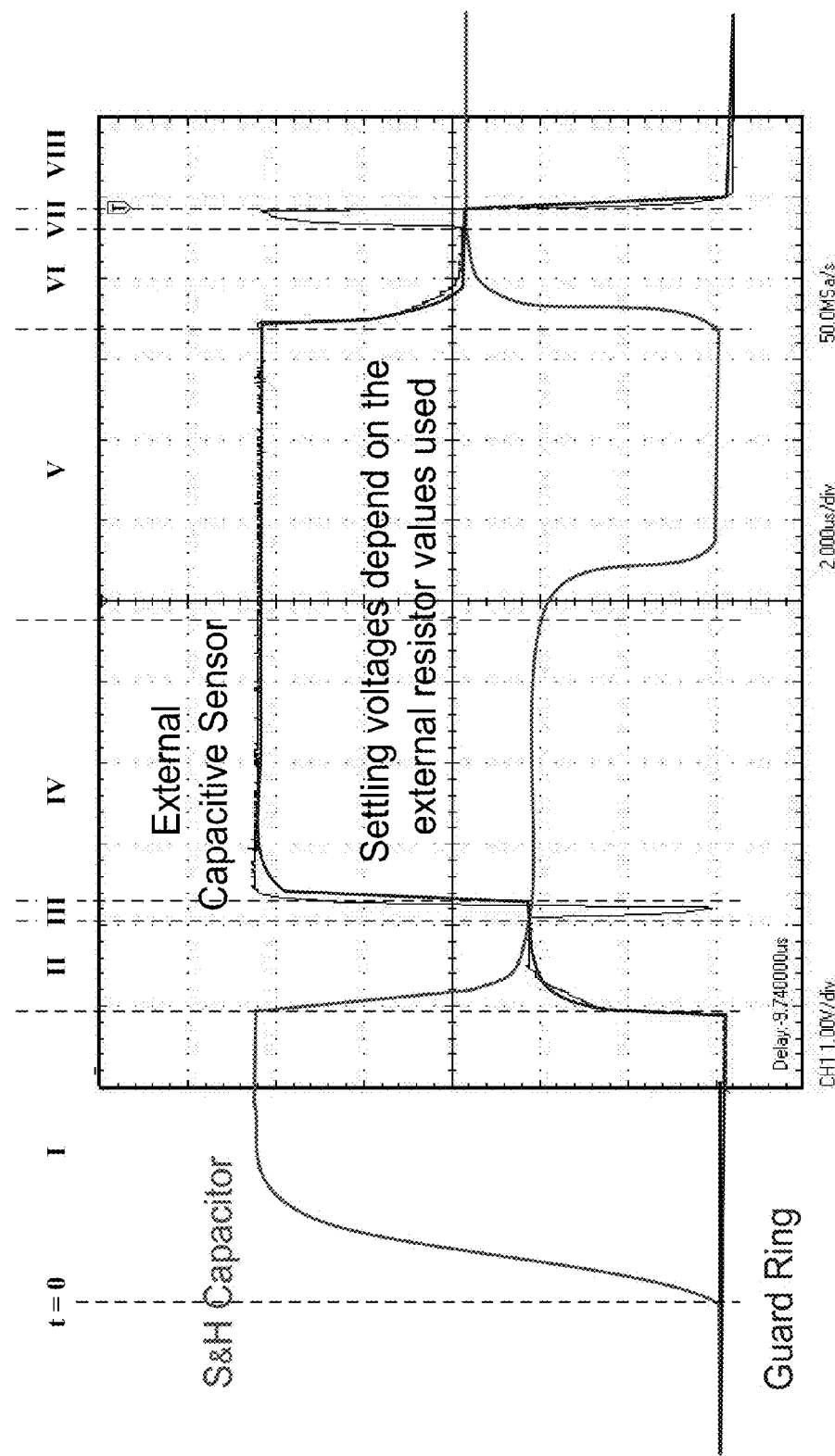
FIG. 12 illustrates a schematic voltage-time diagram of capacitance conversions and guard ring voltage control during these conversions, according to specific example embodiments of this disclosure.

Referring to FIGS. 11 and 12, depicted are schematic voltage-time diagrams of capacitance conversions (FIG. 11), and guard ring voltage control (FIG. 12) during these conversions, according to specific example embodiments of this disclosure. In segment I the capacitors 706 and 716 (sample and hold capacitor) are charged to Vdd, the capacitive sensor capacitor 704 is discharged to Vss, and the guard ring capacitance 702 is discharged to Vss (substantially matching the voltage on the capacitor 704). In segment II the capacitors 706, 716 and 704 are coupled together and a quiescent voltage of about ⅓*Vdd will result when the capacitive touch key 108 is not depressed, and a little less than ⅓*Vdd when depressed. The guard ring capacitance 702 follows the voltage on the capacitor 704 (capacitive sensor) so as to minimize any parasitic capacitances therebetween. Toward the end of segment II the sample and hold capacitor 716 decouples from the capacitors 706 and 704 and retains the quiescent voltage obtained during segment II. In segment III any voltage charge on the capacitor 704 (capacitive sensor) is discharged to substantially Vss, then at the beginning of segment IV the capacitor 704 (capacitive sensor) and the guard ring capacitance 702 are charged to substantially Vdd. Meantime also in segment IV the quiescent voltage stored on the sample and hold capacitor 716 is converted by the ADC 718 to a digital value representing the quiescent voltage and read by the digital processor 106. The digital value from the ADC 718 is used in determining whether the capacitive sensor was being actuated (touched), e.g., quiescent voltage lower then what is expected from a non-actuated touch sensor or not. When the capacitive value of the touch sensor capacitor 704 is actuated (touched)

its capacitance increases and the subsequent quiescent voltage will thereby be less then when not actuated. This is true when the capacitor 704 is initialized to Vss. When the capacitor 704 is initialized to Vdd, the subsequent quiescent voltage is about ⅔*Vdd when the capacitive sensor is not actuated.

In segment V the capacitors 706 and 716 (sample and hold capacitor) are discharged to Vss, the capacitive sensor capacitor 704 and guard ring capacitance 702 have already been charged to Vdd. In segment VI the capacitors 706, 716 and 704 are coupled together and a quiescent voltage of about ⅔*Vdd will result when the capacitive touch key 108 is not depressed, and a little more than ⅔*Vdd when depressed. The guard ring capacitance 702 follows the voltage on the capacitor 704 (capacitive sensor) so as to minimize any parasitic capacitances therebetween. Toward the end of segment VI the sample and hold capacitor 716 decouples from the capacitors 706 and 704 and retains the quiescent voltage obtained during segment VI. In segment VII the capacitor 704 (capacitive sensor) is charged to substantially Vdd, then at the beginning of segment VIII the capacitor 704 (capacitive sensor) and the guard ring capacitance 702 are discharged to substantially Vss. Meantime also in segment VIII the quiescent voltage stored on the sample and hold capacitor 716 is converted by the ADC 718 to a digital value representing the quiescent voltage and read by the digital processor 106. The digital value from the ADC 718 is used in determining whether the capacitive sensor was being actuated (touched), e.g., quiescent voltage lower then what is expected from a non-actuated touch sensor or not. When the capacitive value of the touch sensor capacitor 704 is actuated (touched) its capacitance increases and the subsequent quiescent voltage will thereby be greater than when not actuated. This is true when the capacitor 704 is initialized to Vdd. When the capacitor 704 is initialized to Vss, the subsequent quiescent voltage is about ⅓*Vdd when the capacitive sensor is not actuated, as described hereinabove. These sequences repeat for each one of the touch keys 108. Also by inverting the voltage charge polarities every other capacitive measurement cycle and averaging the capacitive measurement values, a type of differential operation is achieved that minimizes common mode noise and interference, e.g., 60 Hz power line interference.

It is contemplated and within the scope of this disclosure that the guard ring 320 or 420 may or may not present. Wherein the ADC controller 110 controls timing, switch and driver selections for charging and discharging of the capacitive touch sensor capacitor 704 and the ADC sample and hold capacitor 716 (and 706); coupling the capacitors 704 and 706 together, causing the ADC to sample the resulting charge voltage and convert the sampled charge voltage to a digital value, and notifying the digital processor 106 that the digital value of the sampled charge voltage is available. In addition, the ADC controller 110 may control the timing, switch and driver selections for charging and discharging of the guard ring 320 or 420.

Figure 13:
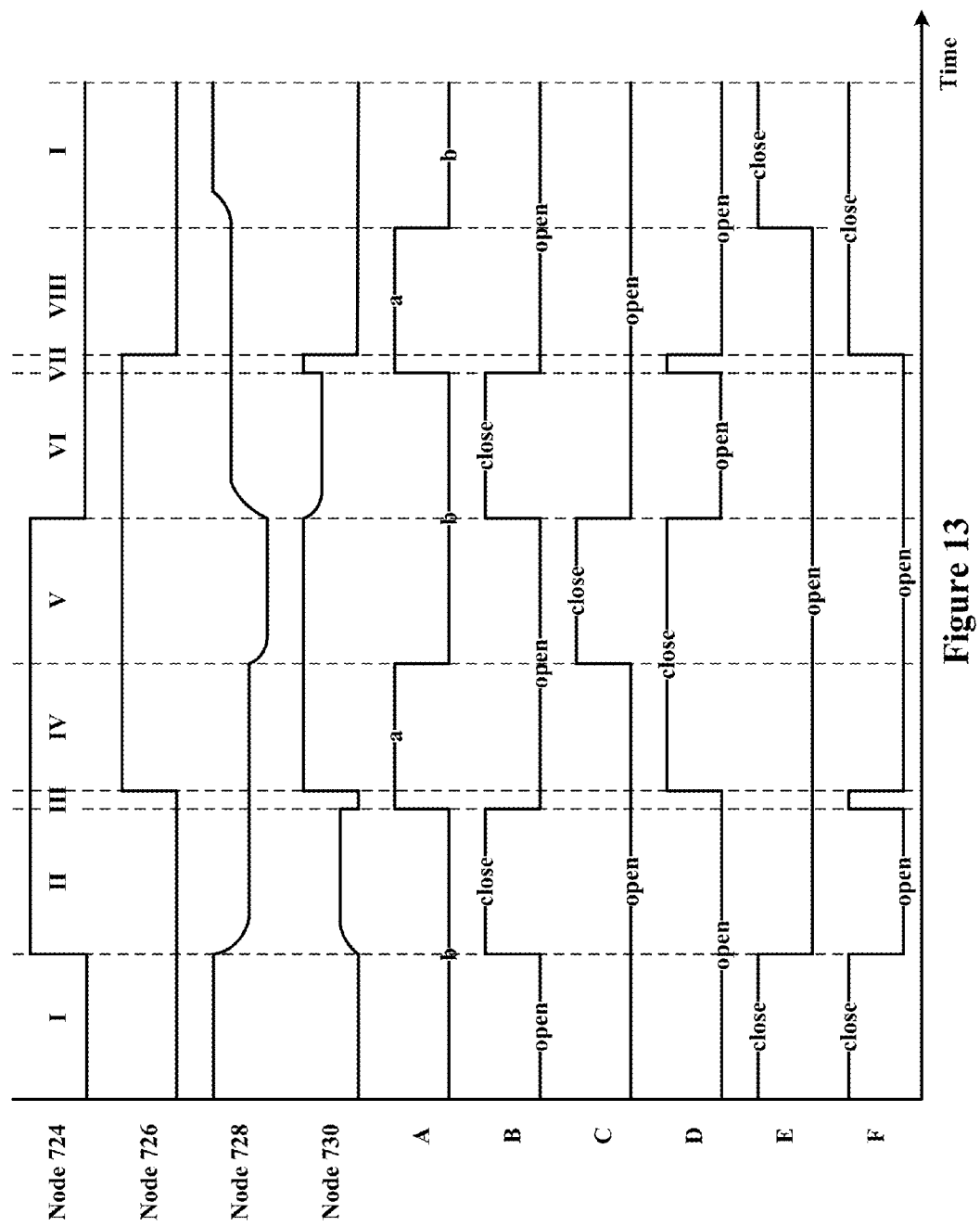
FIG. 13 illustrates a schematic timing diagram of the capacitive conversion system shown in FIG. 7.

Referring to FIG. 13, depicted is a schematic timing diagram of the capacitive conversion system shown in FIG. 7. Voltages on nodes 724, 726, 728 and 730 are shown in relation to the operational open and close combinations of switches A-F. FIG. 13 basically represents the same voltage and timing waveforms as shown in FIG. 12. It is contemplated and within the scope of this disclosure that other and further circuit designs and timing diagrams could be used with equal effect, and one having ordinary skill in electronic circuit design and having the benefit of this disclosure could replicate the results described herein.

Figure 14:
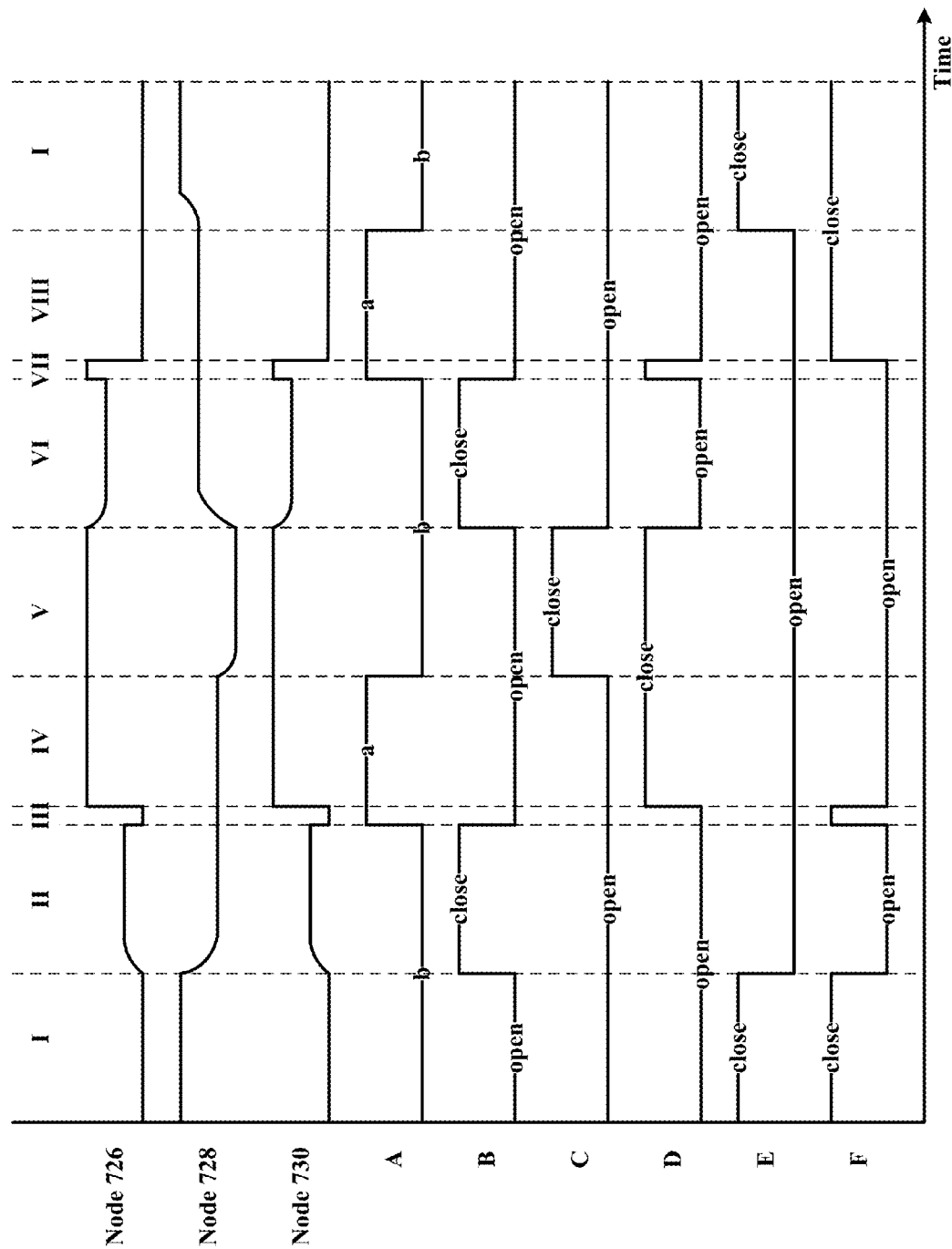
FIG. 14 illustrates a schematic timing diagram of the capacitive conversion system shown in FIGS. 9 and 10.

Referring to FIG. 14, depicted is a schematic timing diagram of the capacitive conversion system shown in FIG. 9. Voltages on nodes 724, 726, 728 and 730 are shown in relation to the operational open and close combinations of switches A-F. FIG. 14 basically represents the same voltage and timing waveforms as shown in FIG. 12. It is contemplated and within the scope of this disclosure that other and further circuit designs and timing diagrams could be used with equal effect, and one having ordinary skill in electronic circuit design and having the benefit of this disclosure could replicate the results described herein.

Figure 15:
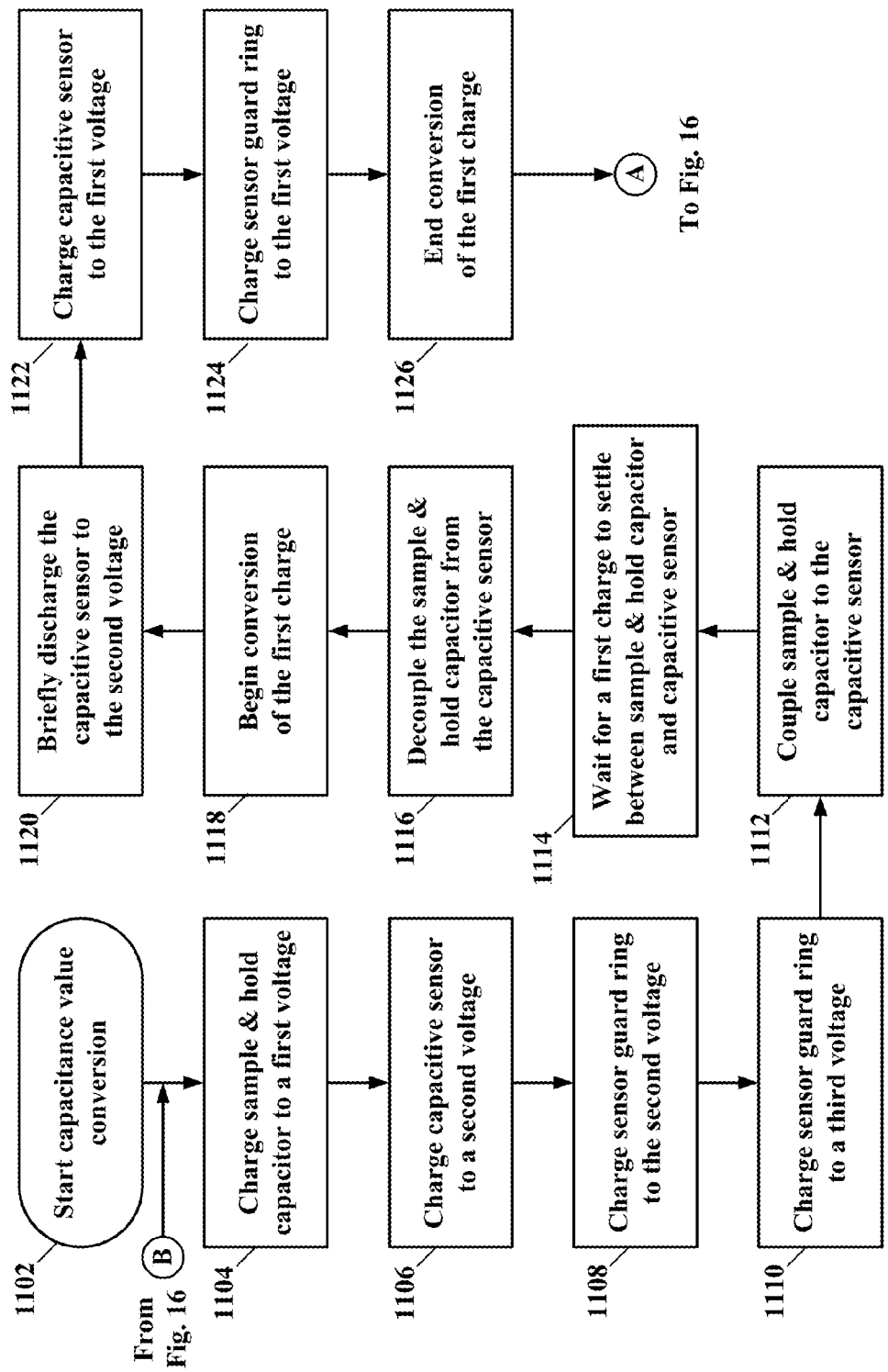
FIGS. 15 and 16 show schematic process flow diagrams of capacitive conversions, according to a specific example embodiment of this disclosure.
Figure 16:
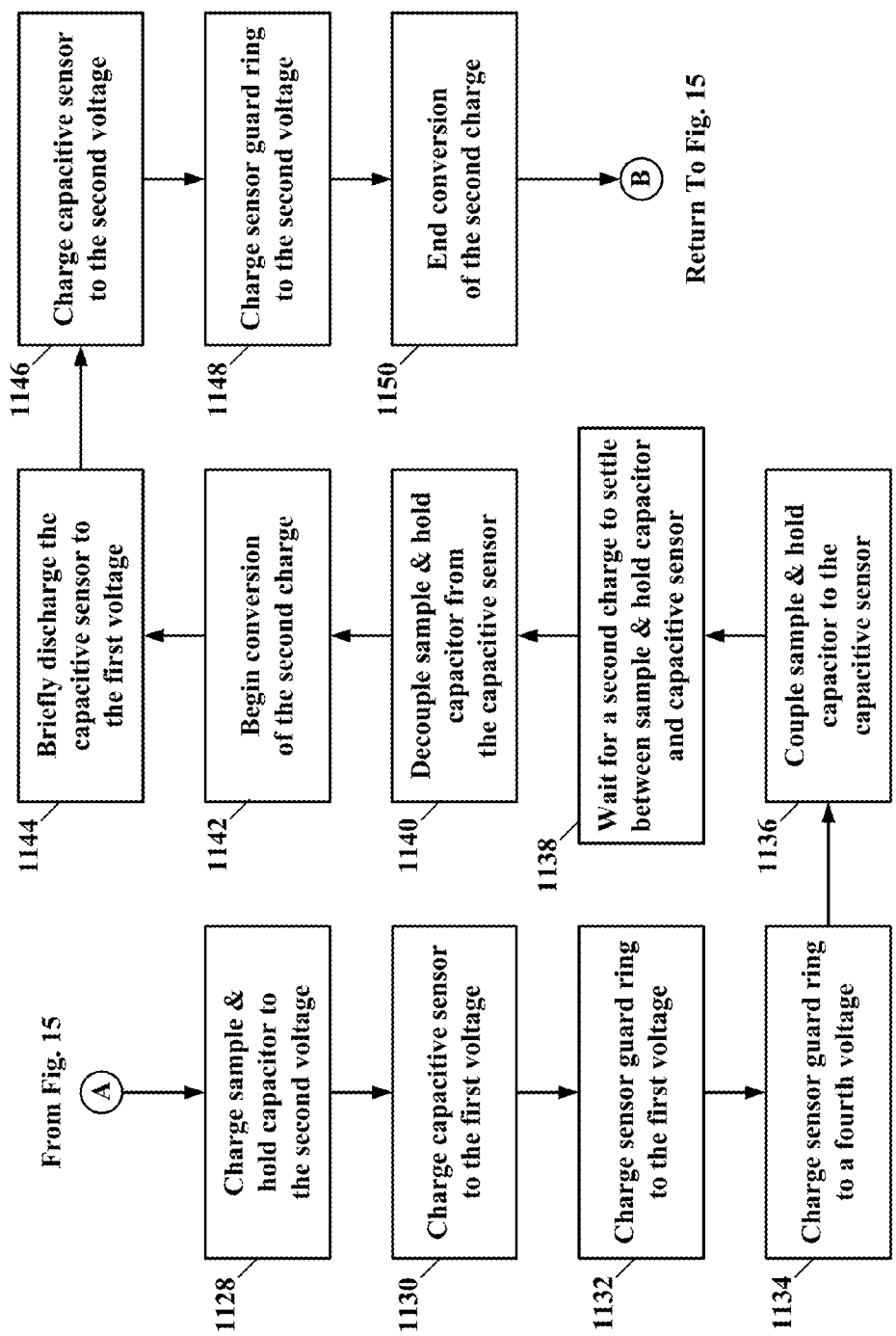

Referring to FIGS. 15 and 16, depicted are schematic process flow diagrams of capacitive conversions, according to a specific example embodiment of this disclosure. The schematic process flow diagrams depicted in FIGS. 15 and 16 represent operation of the mixed signal integrated circuit device having CVD processing capabilities shown in FIGS. 7, 8 and 13. For a first capacitive measurement the following steps may be performed. In step 1102 a capacitance value conversion is started. In step 1104 the sample and hold capacitor combination of the capacitors 706 and 716 are charged to a first voltage. In step 1106 the capacitive sensor is charged to a second voltage. The first voltage may be Vdd and the second voltage may be Vss or visa versa. Optionally, in step 1108 the capacitive sensor guard ring may be charged to the second voltage so as to minimize parasitic capacitance that would otherwise develop at the capacitive sensor due to electrostatic charge caused by a difference of voltage potential between the capacitive sensor and adjacent conductors.

Next in step 1110 the sensor guard ring is charged/discharged to a third voltage contemporaneously with execution of step 1112 in which the sample and hold capacitor combination, previously charged to the first voltage, is coupled to the capacitive sensor, previously charged to the second voltage. Steps 1110 and 1112 may be interchanged so long as both occur contemporaneously with each other. In step 1114 the sample and hold capacitor and the capacitive sensor are coupled together long enough in time for a complete settling to a quiescent first charge. Then in step 1116 the sample and hold capacitor is decoupled from the capacitive sensor and the sample and hold capacitor thereafter retains the settled first charge. In step 1118 conversion to a digital representation of the first charge stored in the sample and hold capacitor begins.

In step 1120 the capacitive sensor is briefly discharged to the second voltage. In step 1122 the capacitive sensor is charged to the first voltage. Optionally, in step 1124 the capacitive sensor guard ring is charged to the first voltage so as to minimize parasitic capacitance that would otherwise develop at the capacitive sensor due to electrostatic charge caused by a difference of voltage potential between the capacitive sensor and adjacent conductors. In step 1126 the conversion of the first charge to a digital representation thereof terminates and is then read by the digital processor 106 for determining the capacitance value of the capacitive sensor 108.

For an optional second capacitive measurement the following steps may be performed. In step 1128 the sample and hold capacitor combination of the capacitors 706 and 716 are charged to the second voltage. In step 1130 the capacitive sensor is charged to the first voltage. Optionally, in step 1132 the capacitive sensor guard ring is charged to the first voltage so as to minimize parasitic capacitance that would otherwise develop at the capacitive sensor due to electrostatic charge caused by a difference of voltage potential between the capacitive sensor and adjacent conductors.

Optionally, next in step 1134 the sensor guard ring is charged/discharged to a fourth voltage contemporaneously with execution of step 1136 in which the sample and hold capacitor combination, previously charged to the second voltage level, is coupled to the capacitive sensor, previously charged to the first voltage. Steps 1134 and 1136 may be interchanged so long as both occur contemporaneously with each other. In step 1138 the sample and hold capacitor combination and the capacitive sensor are coupled together long enough in time for a complete settling to a quiescent second charge. Then in step 1140 the sample and hold capacitor is decoupled from the capacitive sensor and the sample and hold capacitor thereafter retains the settled second charge). In step 1142 a conversion to a digital representation of the second charge stored in the sample and hold capacitor begins.

In step 1144 the capacitive sensor is briefly discharged to the first voltage. In step 1146 the capacitive sensor is charged to the second voltage. Optionally, in step 1148 the capacitive sensor guard ring is charged to the second voltage so as to minimize parasitic capacitance that would otherwise develop at the capacitive sensor due to electrostatic charge caused by a difference of voltage potential between the capacitive sensor and adjacent conductors. In step 1150 the conversion of the second charge to a digital representation thereof terminates and is then read by the digital processor 106 for determining the capacitance value of the capacitive sensor 108. An advantage of obtaining both first and second charge conversions is that they may be processed to reduce common mode noise and interference, e.g., 60 Hz power line interference.

Figure 17:
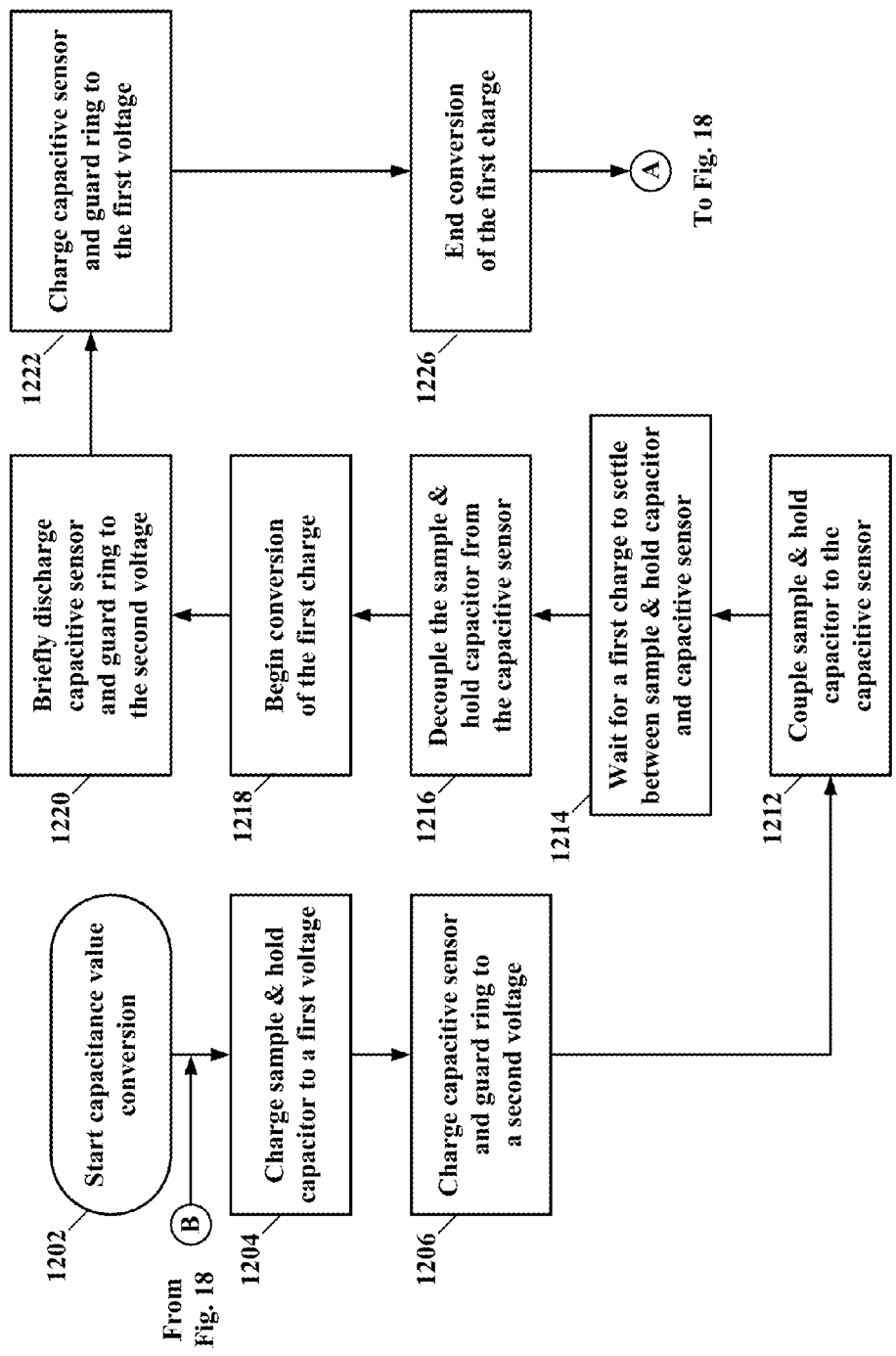
FIGS. 17 and 18 illustrate schematic process flow diagrams of capacitive conversions, according to another specific example embodiment of this disclosure.
Figure 18:
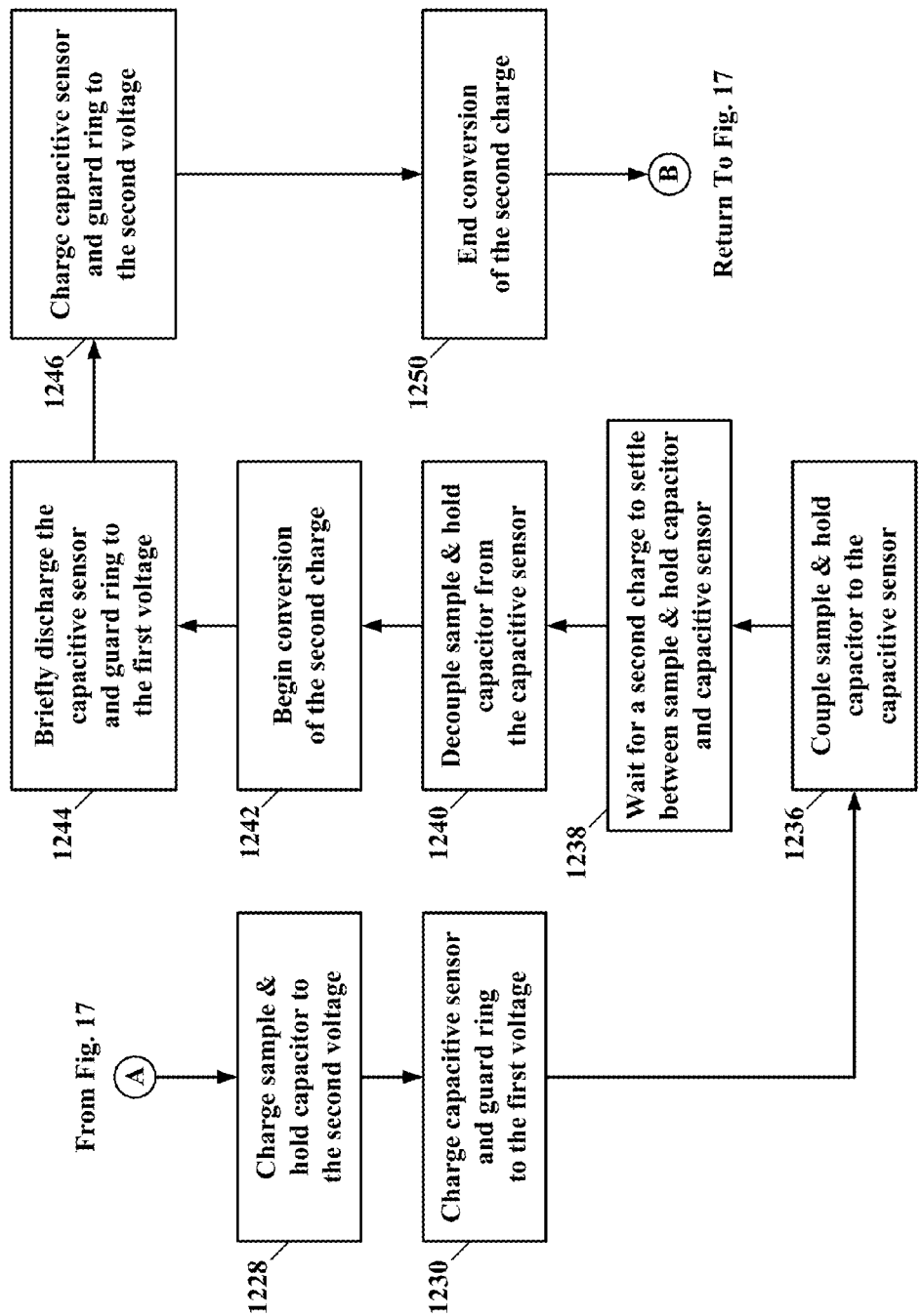

Referring to FIGS. 17 and 18, depicted are schematic process flow diagrams of capacitive conversions, according to another specific example embodiment of this disclosure. The schematic process flow diagrams depicted in FIGS. 17 and 18 represent operation of the mixed signal integrated circuit device having CVD processing capabilities shown in FIGS. 9, 10 and 14. For a first capacitive measurement the following steps may be performed. In step 1202 a capacitance value conversion is started. In step 1204 the sample and hold capacitor combination of the capacitors 706 and 716 are charged to a first voltage. In step 1206 the capacitive sensor and, optionally, the capacitive sensor guard ring are charged to a second voltage. The first voltage may be Vdd and the second voltage may be Vss or visa versa. Optionally, the capacitive sensor guard ring may be charged to the second voltage so as to minimize parasitic capacitance that would otherwise develop at the capacitive sensor due to electrostatic charge caused by a difference of voltage potential between the capacitive sensor and adjacent conductors.

In step 1212 the sample and hold capacitor combination, previously charged to the first voltage, is coupled to the capacitive sensor, previously charged to the second voltage. In step 1214 the sample and hold capacitor and the capacitive sensor are coupled together long enough in time for a complete settling to a common quiescent first charge. Then in step 1216 the sample and hold capacitor is decoupled from the capacitive sensor and the sample and hold capacitor thereafter retains the settled first charge. In step 1218 conversion to a digital representation of the first charge stored in the sample and hold capacitor begins.

In step 1220 the capacitive sensor and, optionally, the guard ring are briefly discharged to the second voltage. In step 1222 the capacitive sensor and, optionally, the guard ring are charged to the first voltage. Optionally, the capacitive sensor guard ring may be charged to the first voltage so as to minimize parasitic capacitance that would otherwise develop at the capacitive sensor due to electrostatic charge caused by a difference of voltage potential between the capacitive sensor and adjacent conductors. In step 1226 the conversion of the first charge to a digital representation thereof terminates and is then read by the digital processor 106 for determining the capacitance value of the capacitive sensor 108.

For an optional second capacitive measurement the following steps may be performed. In step 1228 the sample and hold capacitor combination of the capacitors 706 and 716 are charged to the second voltage. In step 1230 the capacitive sensor and, optionally, the capacitive sensor guard ring are charged to the first voltage. Optionally, the capacitive sensor guard ring may be charged to the first voltage so as to minimize parasitic capacitance that would otherwise develop at the capacitive sensor due to electrostatic charge caused by a difference of voltage potential between the capacitive sensor and adjacent conductors.

In step 1236 the sample and hold capacitor combination, previously charged to the second voltage level, is coupled to the capacitive sensor, previously charged to the first voltage. In step 1238 the sample and hold capacitor combination and the capacitive sensor are coupled together long enough in time for a complete settling to a quiescent second charge. Then in step 1240 the sample and hold capacitor is decoupled from the capacitive sensor and the sample and hold capacitor thereafter retains the settled second charge). In step 1242 a conversion to a digital representation of the second charge stored in the sample and hold capacitor begins.

In step 1244 the capacitive sensor and, optionally, the guard ring are briefly discharged to the first voltage. In step 1246 the capacitive sensor and, optionally, the guard ring are charged to the second voltage. Optionally, the capacitive sensor guard ring may be charged to the second voltage so as to minimize parasitic capacitance that would otherwise develop at the capacitive sensor due to electrostatic charge caused by a difference of voltage potential between the capacitive sensor and adjacent conductors. In step 1250 the conversion of the second charge to a digital representation thereof terminates and is then read by the digital processor 106 for determining the capacitance value of the capacitive sensor 108. An advantage of obtaining both first and second charge conversions is that they may be processed to reduce common mode noise and interference, e.g., 60 Hz power line interference.

Figure 19:
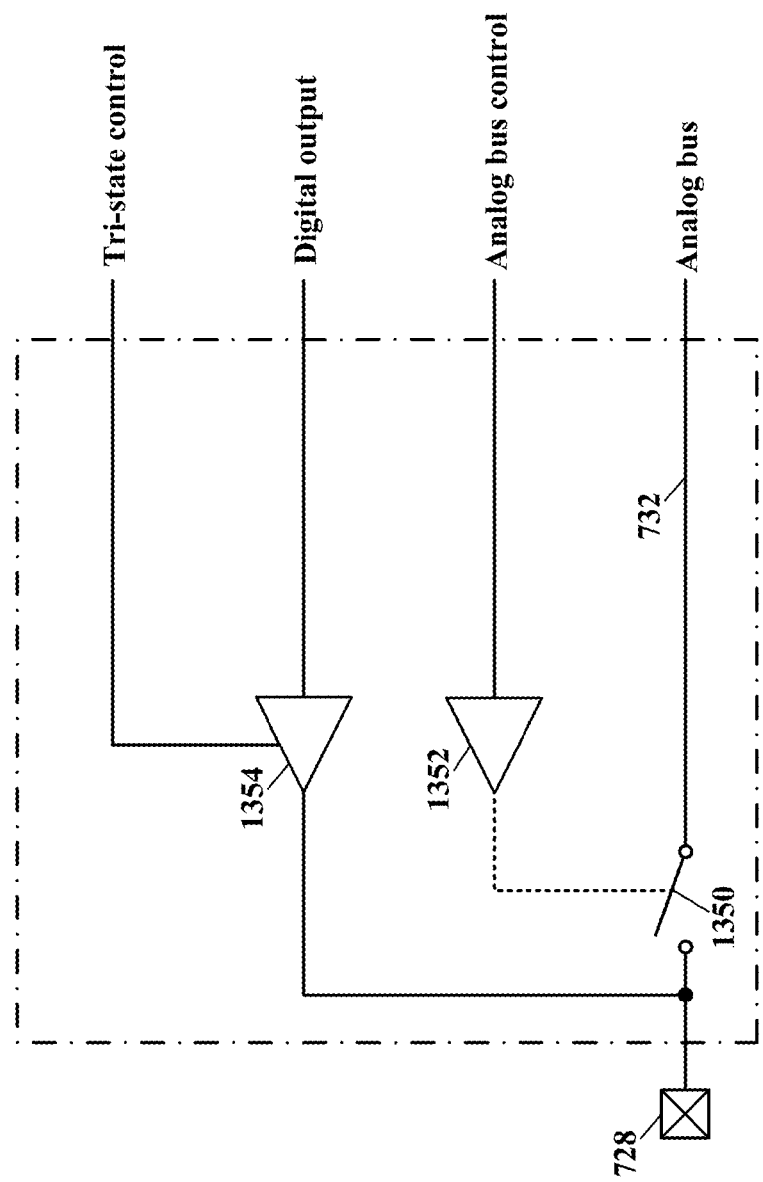
FIG. 19 illustrates a schematic block diagram of multifunction port logic that supports a digital I/O and an analog function via an analog pass gate switch, according to the teachings of this disclosure.

Referring to FIG. 19, depicted is a schematic block diagram of multi-function port logic that supports a digital I/O and an analog function via an analog pass gate switch, according to the teachings of this disclosure. A digital driver 1354 having a tri-state output is coupled to the external node 728 and is controlled by a tri-state control signal from, for example but is not limited to, the digital processor 106. A digital output signal from, for example but is not limited to, the digital processor 106 is coupled to an input of the digital driver 1354.

An analog pass gate switch 1350, which for example may implement switch G in FIGS. 8 and 10, is controlled by analog switch logic 1352 that may be controlled by an analog bus control signal, independent form the ADC channel selection, from, for example but is not limited to, the digital processor 106. Generally an analog multiplexer for the internal ADC is configured to allow only one of the multiple switches to close so that only one of the external pins at a time is connected to the internal ADC. However, according to another embodiment, an analog multiplexer for the ADC may be configured to allow that more than one switch can be controlled to connect an external pin to the analog bus. Hence, the control logic 1352 and analog pass gate switches 1350 may either be controlled independently from the analog multiplexer or may be part of the analog multiplexer. The analog pass gate switch 1350 when closed enables direct coupling of the node 728 to an analog bus 732, as more fully described hereinabove. When the analog pass gate switch 1350 is closed, the output of the digital driver 1354 is put into a high impedance state by the tri-state control, thereby minimally affecting the node 728 when being used as an analog port. It is contemplated and within the scope of this disclosure that other functions may be included according to other embodiments described herein.

Figure 20:
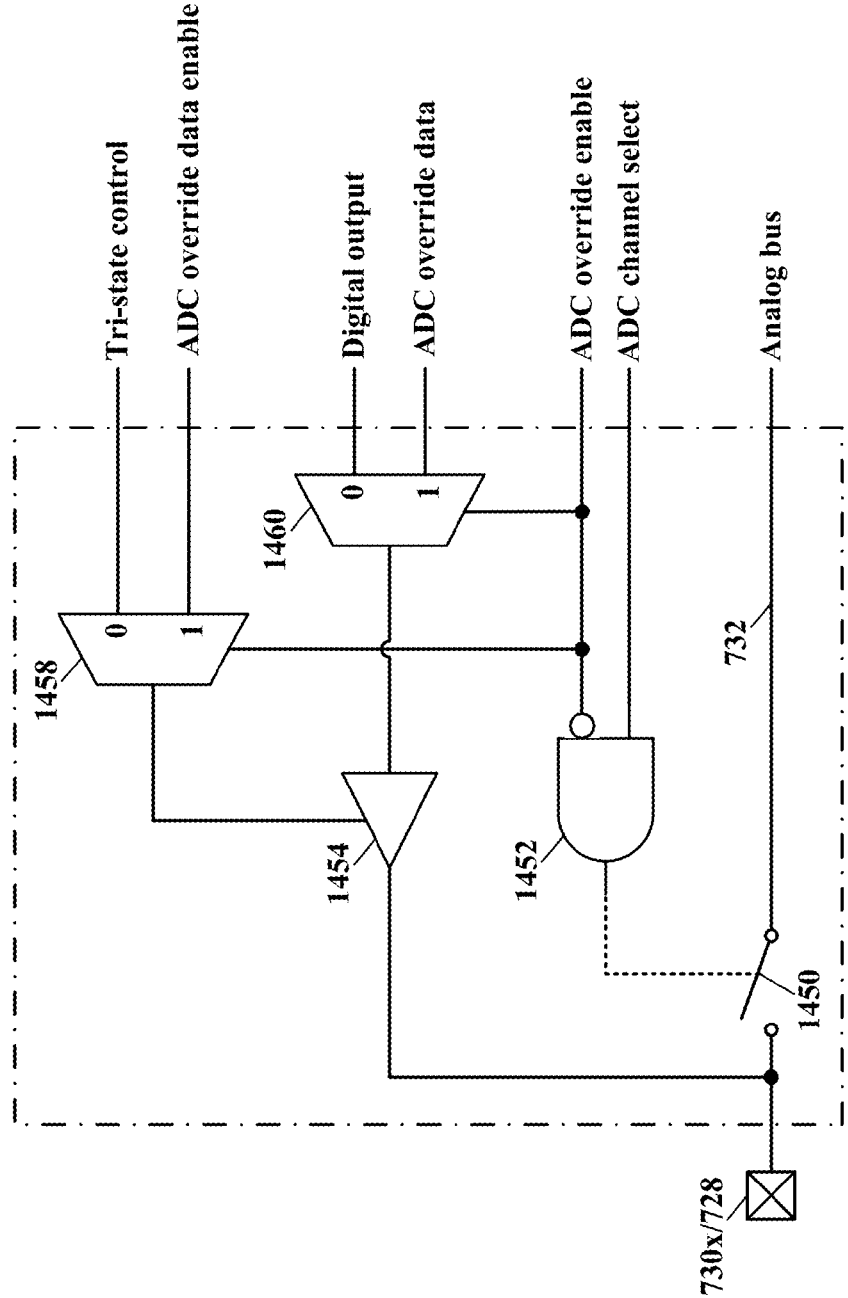
FIG. 20 illustrates a schematic block diagram of multifunction port logic that supports a digital I/O and an analog function via an analog pass gate switch wherein the analog function can be overridden to precharge and discharge a capacitive touch sensor connected to the port with ADC controller logic, according to the teachings of this disclosure.

Referring to FIG. 20, depicted is a schematic block diagram of multi-function port logic that supports a digital I/O and an analog function via an analog pass gate switch wherein in addition the analog function can be overridden to precharge and discharge a capacitive touch sensor connected to the port with ADC controller logic, according to the teachings of this disclosure. Such port logic may be used for any of the external pins 730 and when the analog multiplexer is configured to allow more than one switch to be closed then also for pin 728. Switching between digital and analog functions at the node 730 can be processor intensive and may require a complex program to properly handle all related digital and analog functions required of the node 730, as more fully described hereinabove. In order to take the load, e.g., program steps and/or control functions, off of the processor 106 during setup and determination, e.g., FIGS. 8-16, of the capacitance value of each capacitive sensor, an ADC override feature may be incorporated into the capacitive touch determination circuits described herein. Use of a dedicated ADC controller incorporating the circuit functions shown in FIG. 20 will save digital processor program steps and allow for the processor to perform other functions during determination of the capacitive sensor capacitance. However, according to other embodiments, the override function can also be omitted. Also, according to yet other embodiments, the port logic as shown in FIGS. 19 and 20 may be combined to create a universal port logic for each external pin, as for example, shown in FIGS. 8 and 10. Thus, a universal port logic for all external pins may have two pass gates which can be controlled independently to connect to the analog bus or may have a single pass gate which is part of the analog multiplexer that allows to be controlled by an independent enable signal.

A digital driver 1454 having a tri-state output is coupled to the external node 730 and is controlled by a tri-state control signal from a multiplexer 1458. A digital output signal from a multiplexer 1460 is coupled to an input of the digital driver 1454. An analog pass gate switch 1450, which may implement the switch I in FIGS. 8 and 10, is controlled by analog switch logic 1452. When the ADC override enable signal is at a logic low the multiplexer 1458 couples the tri-state control signal to control the tri-state output of the digital driver 1454, and the multiplexer 1460 couples the digital output signal to the input of the digital driver 1454. The ADC channel select (analog bus control) controls the analog pass gate switch 1450 to directly couple the node 730 to the analog bus 732, as more fully described hereinabove. In this configuration, the circuit shown in FIG. 20 functions in substantially the same fashion as the circuit shown in FIG. 19.

However, when the ADC override enable signal is at a logic high the multiplexer 1458 couples the ADC override data enable signal to control the tri-state output of the digital driver 1454, and the multiplexer 1460 couples the ADC override data signal to the input of the digital driver 1454. The analog pass gate switch 1450 is forced to decouple the analog bus 732 from the node 730. In this configuration the ADC override data enable and ADC override data signals may be provided by an ADC logic controller (not shown), and may be used to charge or discharge a capacitive touch sensor coupled to the node 730 without requiring program intensive actions from the digital processor 106.

Figure 21:
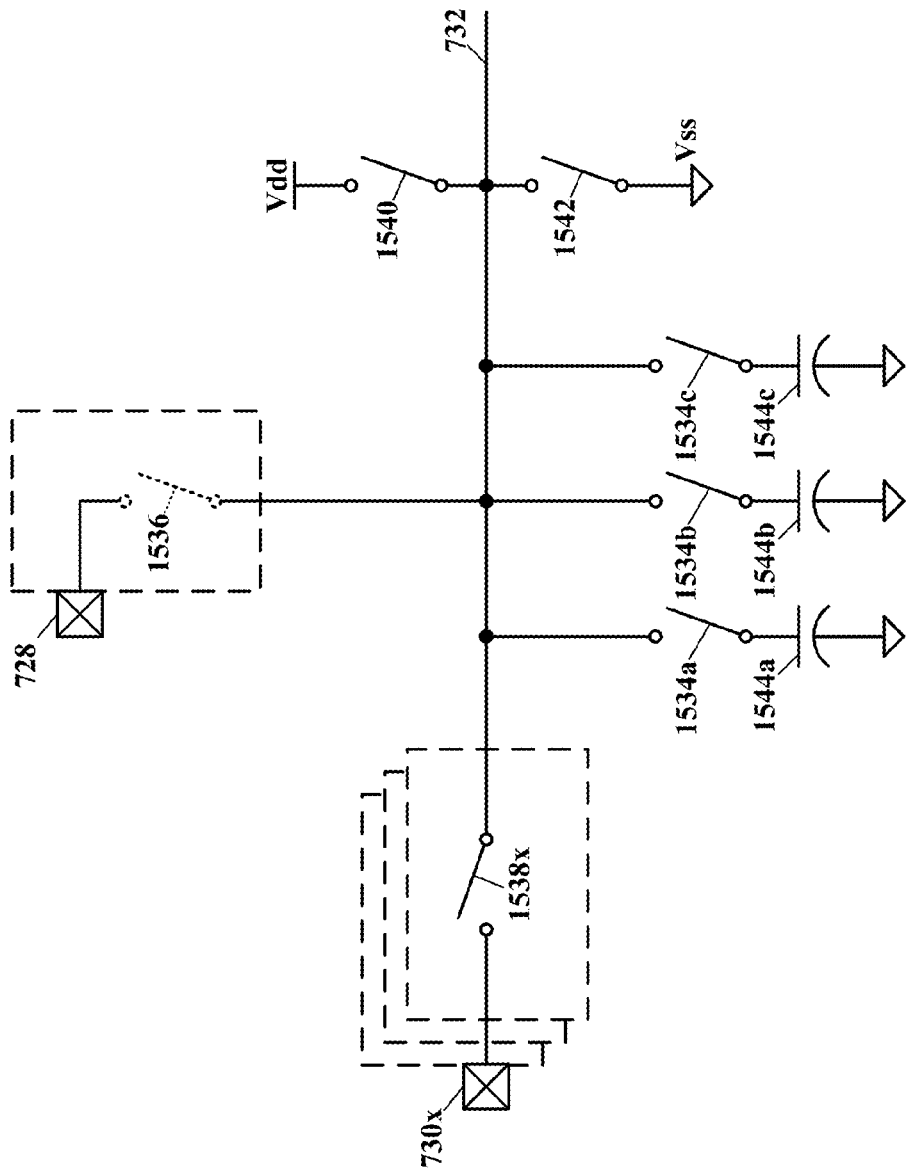
FIG. 21 illustrates a schematic block diagram of analog and digital connection configurations, according to specific example embodiments of this disclosure.

Port logic for node 728 may be implemented as shown in FIG. 19 or FIG. 20 as explained above. Port logic for nodes 724 and 726 may also be implemented as shown in FIG. 20 or 21, for example, without the "analog in" pass gate switch 1350. The plurality of Nodes 730 can be implemented as shown in FIG. 20. As mentioned above, a universal port may be used for all external pins. Additional functions can be implemented to support other functionalities according to a respective external pin.

Referring to FIG. 21, depicted is a schematic block diagram of analog and digital connection configurations, according to specific example embodiments of this disclosure. A plurality of analog pass gate switches 1538 may implement an analog multiplexer and couple and decouple a plurality of nodes 730x to and from an analog bus 732, e.g., selection of each of a plurality of capacitive touch sensors. Either a direct connection couples together the node 728 and the analog bus 732 (e.g., see FIGS. 7 and 9), or an optional analog pass gate switch 1536 may couple and decouple the node 728 to and from the analog bus 732 (e.g., see FIGS. 8 and 10). As explained above, the additional pass gate switch 1536 can be part of the analog multiplexer if the multiplexer is designed to allow more than one switch to be closed. A plurality of switches 1534 may couple and decouple additional sample and hold capacitors 1544 to and from the analog bus 732. Switch 1540 may be used to charge the analog bus 732 to Vdd, and switch 1542 may be used to discharge the analog bus 732 to Vss.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

The invention claimed is:

1. A microcontroller comprising:
   a plurality of ports coupled with an analog bus through an analog multiplexer;
   an analog-to-digital converter (ADC) coupled with the analog bus, wherein the ADC comprises a sample and hold capacitor; and
   a sample and hold pull up/down circuit coupled with the sample and hold capacitor, wherein each one of the plurality of ports is programmable to operate as an analog input port, a digital input port or a digital output port and comprises a respective port pull up/down circuit.

2. The microcontroller according to claim 1, wherein each one of the plurality of ports further comprises an override function allowing a primary analog or digital function to be overridden with a digital override value.

3. The microcontroller according to claim 2, wherein each port comprises a first multiplexer receiving digital and override values and a second multiplexer receiving digital tri-state and override control values, wherein the multiplexers are controlled by an override enable signal.

4. The microcontroller according to claim 3, wherein each one of the plurality of ports is coupled with an associated tri-state register, an associated override control register, a digital output value register, and an override value register.

5. The microcontroller according to claim 4, wherein the analog switch is part of the analog multiplexer.

6. The microcontroller according to claim 2, wherein the primary analog function is provided by an analog switch coupling an external pin of a port with the analog bus.

7. The microcontroller according to claim 6, wherein the analog multiplexer comprises a plurality of analog switches and is configured to allow more than one analog switch to be closed.

8. A microcontroller comprising:
a plurality of ports coupled with an analog bus through an analog multiplexer;
an analog-to-digital converter (ADC) coupled with the analog bus, wherein the ADC comprises a sample and hold capacitor;
a sample and hold pull up/down circuit coupled with the sample and hold capacitor, and
a programmable control unit for automatically controlling a conversion sequence.

9. The microcontroller according to claim 8, wherein for a programmable pre-charge time of the conversion sequence the control unit is operable to independently control an associated port to charge an external node to a first voltage and to decouple the internal sample & hold capacitor and charge the sample & hold capacitor to a second voltage different from said first voltage.

10. The microcontroller according to claim 9, wherein for a programmable acquisition or share time of said conversion sequence the control unit is further operable to control the analog multiplexer to connect the external node with the sample & hold capacitor.

11. The microcontroller according to claim 9, wherein the control unit is operable to include a further pre-charge and acquisition or share period to automatically perform two sequential measurements.

12. A microcontroller comprising:
a digital processor with memory;
an analog-to-digital converter (ADC) controller coupled to the digital processor;
a plurality of input/output ports that can be programmed to function as analog nodes or digital input output nodes;
an analog multiplexer controlled by the ADC controller for selecting one of said analog nodes and coupling the analog node to an analog bus;
an analog-to-digital converter (ADC) comprising a sample & hold capacitor coupled to the analog bus for converting an analog voltage on the analog bus to a digital representation thereof and having a digital output coupled to the digital processor for conveying the digital representation; and
a sample and hold pull up/down circuit coupled with the sample and hold capacitor.

13. The microcontroller according to claim 12, wherein each one of the plurality of input/output ports is programmable to operate as an analog input port, a digital input or output port and comprises a respective port pull up/down circuit and further comprises an override function allowing a primary analog or digital function to be overridden with a digital override value.

14. The microcontroller according to claim 12, further comprising:
a plurality of digital output drivers controlled by the ADC controller;
a first analog node coupled to a first analog bus in the microcontroller;
the first analog bus is switchably coupled to a power supply common, a power supply voltage, or a second analog bus;
the second analog bus is switchably coupled to the power supply common, the power supply voltage, the sample and hold capacitor, or the first analog bus; and
the sample and hold capacitor is switchably coupled to either the first analog bus or an input of the ADC,
wherein the first analog node is adapted for coupling to an external capacitive sensor.

15. The microcontroller according to claim 14, further comprising at least two digital output nodes coupled to respective ones of the plurality of digital output drivers, wherein the at least two digital output nodes are adapted for coupling to a resistor voltage divider network that drives a voltage onto a guard ring associated with the capacitive sensor.

16. The microcontroller according to claim 15, further comprising a second analog node coupled to the second analog bus and adapted for coupling to an external capacitor.

17. The microcontroller according to claim 16, further comprising at least one internal capacitor switchably coupled to the second analog bus.

18. The microcontroller according to claim 14, further comprising at least one analog output driver coupled with the first analog bus and adapted for coupling to an external guard ring associated with the capacitive sensor, wherein a voltage on the guard ring is substantially the same voltage as on the capacitive sensor.

19. The microcontroller according to claim 14, wherein the ADC controller controls an automatic conversion sequence such that for a programmable pre-charge time of the conversion sequence the ADC controller is operable to independently control an associated port to charge an external node to a first voltage and to decouple the internal sample & hold capacitor and charge the sample & hold capacitor to a second voltage different from said first voltage.

20. The microcontroller according to claim 19, wherein for a programmable acquisition or share time of said conversion sequence, the ADC controller is further operable to control the analog multiplexer to connect the external node with the sample & hold capacitor.

21. The microcontroller according to claim 20, wherein the ADC controller is operable to include a further precharge and acquisition or share period to automatically perform two sequential measurements.

22. The microcontroller according to claim 19, wherein timing parameters for the conversion sequence are stored in registers.

23. A capacitive sensor system, said system comprising:
a capacitive sensor; and
a microcontroller according to claim 12.

24. The capacitive sensor system according to claim 23, the system further comprising:
a guard ring associated with the capacitive sensor;
a first resistor coupled to the guard ring;
a second resistor coupled to the guard ring;
a plurality of digital output drivers controlled by the ADC controller; and
at least two digital output nodes of the ADC controller coupled to respective ones of the plurality of digital output drivers, wherein one of the at least two digital output nodes is coupled to the first resistor and the other one of the at least two digital output nodes is coupled to the second resistor.

25. A method for measuring capacitance of a capacitive sensor with a microcontroller comprising a plurality of ports coupled with an analog bus through an analog multiplexer; an analog-to-digital converter (ADC) coupled with the analog bus, wherein the ADC comprises a sample & hold capacitor; and a sample & hold pull up/down circuit coupled with the sample and hold capacitor, said method comprising the steps of:

coupling one of the plurality of ports with the capacitive sensor, and for a pre-charge period, independently charging the capacitive sensor by means of said one of the plurality of ports to a first voltage and decoupling the internal sample & hold capacitor by means of said analog multiplexer and charging the sample & hold capacitor to a second voltage different from said first voltage by means of said sample & hold pull up/down circuit.

26. The method according to claim 25, wherein the steps for the pre-charge period are automatically performed by an ADC controller independent from a central processing unit of said microcontroller.

27. The method according to claim 25, wherein for a programmable acquisition or share time period the method further comprises controlling the analog multiplexer to connect the capacitive sensor with the sample & hold capacitor to share charges on the sample & hold capacitor and the capacitive sensor.

28. The method according to claim 27, further comprising decoupling said sample & hold capacitor from the one of the plurality of ports and determining a first charge value of the sample & hold capacitor by means of the ADC.

29. The method according to claim 28, wherein the steps for determining the first charge value are automatically performed by an ADC controller independent from a central processing unit of said microcontroller.

30. The method according to claim 29, further comprising while determining the charge value, pre-charging the capacitive sensor to the second voltage.

31. The method according to claim 30, further comprising after determining the charge value, pre-charging the sample & hold capacitor to the first voltage.

32. The method according to claim 31, after pre-charging the sample & hold capacitor, controlling the analog multiplexer to connect the capacitive sensor with the sample & hold capacitor to share charges on the sample & hold capacitor and the capacitive sensor.

33. The method according to claim 32, further comprising decoupling said sample & hold capacitor from the one of the plurality of ports and determining a second charge value of the sample & hold capacitor by means of the ADC.

34. The method according to claim 33, wherein the steps for determining the first and second charge value are automatically performed by an ADC controller independent from a central processing unit of said microcontroller.

* * * * *